United States Patent
Liguori et al.

(10) Patent No.: US 11,520,530 B2
(45) Date of Patent: Dec. 6, 2022

(54) PERIPHERAL DEVICE FOR CONFIGURING COMPUTE INSTANCES AT CLIENT-SELECTED SERVERS

(71) Applicant: Amazon Technologies, Inc., Seattle, WA (US)

(72) Inventors: Anthony Nicholas Liguori, Bainbridge Island, WA (US); Eric Jason Brandwine, Haymarket, VA (US)

(73) Assignee: Amazon Technologies, Inc., Seattle, WA (US)

( * ) Notice: Subject to any disclaimer, the term of this patent is extended or adjusted under 35 U.S.C. 154(b) by 294 days.

(21) Appl. No.: 16/581,619

(22) Filed: Sep. 24, 2019

(65) Prior Publication Data
US 2021/0089239 A1    Mar. 25, 2021

(51) Int. Cl.
*G06F 3/06* (2006.01)
*G06F 9/455* (2018.01)
(Continued)

(52) U.S. Cl.
CPC ............ *G06F 3/0664* (2013.01); *G06F 3/067* (2013.01); *G06F 3/0614* (2013.01);
(Continued)

(58) Field of Classification Search
CPC ...... G06F 3/0664; G06F 3/0614; G06F 3/067; G06F 9/45558; G06F 2009/45595;
(Continued)

(56) References Cited

U.S. PATENT DOCUMENTS 6,741,585 B1    5/2004  Munoz et al.
7,484,091 B2    1/2009  Bade et al.
(Continued)

FOREIGN PATENT DOCUMENTS

CN    105027108 A    11/2015
CN    105308931 A    2/2016
(Continued)

OTHER PUBLICATIONS

U.S. Appl. No. 16/581,646, filed Sep. 24, 2019, Anthony Nicholas Liguori.
(Continued)

*Primary Examiner* — Michael W Ayers
(74) *Attorney, Agent, or Firm* — Alexander A. Knapp; Kowert, Hood, Munyon, Rankin & Goetzel, P.C.

(57) ABSTRACT

A peripheral device includes one or more processors and a memory storing program instructions that when executed implement virtualization offloading components of a virtualized computing service, including a storage manager. The offloading components establish network connectivity with a control plane of the service. Based on detecting that a hardware server, in a separate enclosure, has been linked to the peripheral device, the hardware server is presented as a virtualization host of the service. The offloading components initiate compute instance configuration operations at the server in response to commands issued to the control plane, including at least one configuration operation initiated by the storage manager to enable access to a logical storage device from a compute instance.

20 Claims, 17 Drawing Sheets

(51) Int. Cl.
*H05K 7/14* (2006.01)
*H04L 67/1097* (2022.01)
*G06F 9/4401* (2018.01)

(52) U.S. Cl.
CPC ...... *G06F 9/45558* (2013.01); *H04L 67/1097* (2013.01); *H05K 7/1489* (2013.01); *G06F 9/4411* (2013.01); *G06F 9/45541* (2013.01); *G06F 2009/45579* (2013.01); *G06F 2009/45595* (2013.01)

(58) Field of Classification Search
CPC ......... G06F 2009/45579; G06F 9/4411; G06F 9/45541; H05K 7/1489; H04L 67/1097
See application file for complete search history.

(56) References Cited

U.S. PATENT DOCUMENTS

| | | | |
|---|---|---|---|
| 7,620,731 | B1 | 11/2009 | Dasan |
| 7,814,255 | B1* | 10/2010 | Deva ................... G06F 13/4081 710/302 |
| 7,996,836 | B1 | 8/2011 | McCorkendale et al. |
| 8,032,899 | B2 | 10/2011 | Archer et al. |
| 8,127,292 | B1 | 2/2012 | Dobrovolskiy et al. |
| 8,201,161 | B2 | 6/2012 | Challener et al. |
| 8,239,557 | B2 | 8/2012 | McCune et al. |
| 8,396,946 | B1 | 3/2013 | Brandwine et al. |
| 8,433,802 | B2 | 4/2013 | Head et al. |
| 8,514,868 | B2 | 8/2013 | Hill |
| 8,589,918 | B1* | 11/2013 | Sapuntzakis .......... G06F 9/4451 718/1 |
| 8,612,968 | B2* | 12/2013 | DeHaan ................ G06F 9/4411 717/177 |
| 8,745,755 | B2 | 6/2014 | Borzycki et al. |
| 9,042,384 | B2 | 5/2015 | Sridharan et al. |
| 9,203,748 | B2 | 12/2015 | Jiang et al. |
| 9,323,552 | B1 | 4/2016 | Adogla et al. |
| 9,361,145 | B1 | 6/2016 | Wilson et al. |
| 9,485,323 | B1 | 11/2016 | Stickle et al. |
| 9,954,763 | B1 | 4/2018 | Ye et al. |
| 9,979,694 | B2 | 5/2018 | Brandwine et al. |
| 10,057,267 | B1 | 8/2018 | Miller et al. |
| 10,095,537 | B1 | 10/2018 | Neogy et al. |
| 10,498,611 | B1 | 12/2019 | Kloberdans et al. |
| 10,812,366 | B1 | 10/2020 | Berenberg et al. |
| 2003/0070027 | A1* | 4/2003 | Ng ...................... G06F 13/4086 710/305 |
| 2004/0177132 | A1 | 9/2004 | Zhang et al. |
| 2005/0013280 | A1 | 1/2005 | Buddhikot et al. |
| 2005/0224307 | A1 | 10/2005 | Steffen |
| 2005/0251806 | A1 | 11/2005 | Auslander et al. |
| 2006/0206658 | A1 | 9/2006 | Hendel et al. |
| 2008/0244553 | A1 | 10/2008 | Cromer et al. |
| 2009/0327576 | A1 | 12/2009 | Oshins |
| 2010/0070970 | A1 | 3/2010 | Hu et al. |
| 2010/0106822 | A1 | 4/2010 | Nagai et al. |
| 2010/0205375 | A1 | 8/2010 | Challener et al. |
| 2011/0075667 | A1 | 3/2011 | Li et al. |
| 2011/0131443 | A1 | 6/2011 | Laor et al. |
| 2011/0255423 | A1 | 10/2011 | Gustin |
| 2011/0314469 | A1* | 12/2011 | Qian ................... H04L 49/9057 718/1 |
| 2012/0054832 | A1* | 3/2012 | Ghosh .................. H04L 9/3226 726/4 |
| 2012/0110650 | A1 | 5/2012 | Van Biljon et al. |
| 2012/0124129 | A1 | 5/2012 | Klimentiev et al. |
| 2012/0179802 | A1 | 7/2012 | Narasimhan et al. |
| 2013/0287026 | A1 | 10/2013 | Davie |
| 2013/0291087 | A1 | 10/2013 | Kailash et al. |
| 2013/0305341 | A1 | 11/2013 | Baker et al. |
| 2013/0315243 | A1 | 11/2013 | Huang et al. |
| 2014/0208413 | A1 | 7/2014 | Grobman et al. |
| 2015/0160884 | A1 | 6/2015 | Scales et al. |
| 2015/0172169 | A1* | 6/2015 | DeCusatis ............. H04L 47/12 718/1 |
| 2015/0195137 | A1 | 7/2015 | Kashyap |
| 2015/0271027 | A1 | 9/2015 | Goldberg |
| 2015/0356031 | A1* | 12/2015 | Gintis ................. G06F 11/3664 710/61 |
| 2015/0381484 | A1* | 12/2015 | Hira ..................... H04L 12/4633 370/390 |
| 2015/0381773 | A1 | 12/2015 | Visser |
| 2016/0026573 | A1 | 1/2016 | Jacobs et al. |
| 2016/0072816 | A1* | 3/2016 | Makhervaks ....... H04L 63/0254 726/13 |
| 2016/0072910 | A1 | 3/2016 | Eicher et al. |
| 2016/0077845 | A1 | 3/2016 | Earl et al. |
| 2016/0170781 | A1 | 6/2016 | Liguori et al. |
| 2016/0170785 | A1 | 6/2016 | Liguori et al. |
| 2016/0315879 | A1 | 10/2016 | Morris |
| 2017/0123935 | A1* | 5/2017 | Pandit ................. G06F 11/1451 |
| 2017/0286486 | A1 | 10/2017 | Pang |
| 2017/0300354 | A1 | 10/2017 | Dalal et al. |
| 2017/0322899 | A1* | 11/2017 | Ni et al. ............. G06F 12/0246 |
| 2017/0366606 | A1 | 12/2017 | Ben-Shaul et al. |
| 2017/0371546 | A1* | 12/2017 | Rivera .................. G06F 3/0604 |
| 2018/0004954 | A1* | 1/2018 | Liguori ................. H04L 9/3249 |
| 2018/0024964 | A1* | 1/2018 | Mao ...................... G06F 15/161 711/173 |
| 2018/0139174 | A1 | 5/2018 | Thakkar et al. |
| 2018/0196947 | A1 | 7/2018 | Davis et al. |
| 2018/0260125 | A1 | 9/2018 | Botes et al. |
| 2019/0188763 | A1 | 6/2019 | Ye et al. |
| 2020/0142842 | A1 | 5/2020 | Ryu |
| 2021/0037105 | A1* | 2/2021 | Smith-Denny ......... H04L 67/51 |

FOREIGN PATENT DOCUMENTS

| | | |
|---|---|---|
| CN | 108431778 A | 8/2018 |
| EP | 1701259 | 9/2006 |
| EP | 2557498 | 2/2013 |
| KR | 20040001211 | 1/2004 |
| KR | 20120049929 A1 | 5/2012 |
| WO | 2011041162 A1 | 4/2011 |

OTHER PUBLICATIONS

International Search Report and Written Opinion from PCT?US2020/050186, dated Dec. 4, 2020, pp. 1-11.
U.S. Appl. No. 14/860,494, filed Sep. 21, 2015, Kevin Christopher Miller.
Amazon AWS, Example: Cisco ASA Device, Retrieved from http://docs.aws.amazon.com/AmazonVPC/latest/NetworkAdminGuide/Cisco_ASA(WaybackMachine); Feb. 2013, pp. 1-5.
Zsgur Ulusoy, "Processing Real-Time Transactions in a Replicated Database System," 1994 Kluwer Academic Publishers, Boston, Revised Sep. 10, 1993, pp. 1-32.
Sergio Almeida, et al., "ChainReaction: a Causal+ Consistent Datastore based on Chain Replication," Eurosys'13 Apr. 15-17, 2013, Prague, Czech Republic, Copyright 2013 ACM 978-1-4503-1994-2/13/04, pp. 85-98.
Scott Lystig Fritchie, "Chain Replication in Theory and in Practice," Erlang'10, Sep. 30, 2010, Baltimore, Maryland, USA. Copyright 2010 ACM 978-1-4503-0253-1/10/09, pp. 1-11.
Robbert van Renesse, et al, "Chain Replication for Supporting High Throughput and Availability," USENIX Association, OSDI 2004: 6th Symposium on Operating Systems Design and Implementation, pp. 91-104.
Philip A. Bernstein, et al, "Concurrency Control and Recovery in Database Systems," Addison-Wesley Publication Company, ISBN 0-201-10715-5, 1987, pp. 1-58.
From Wikipedia, the free encyclopedia, "Bromium," downloaded on Jun. 27, 2016 from https://en.wikipedia.org/wiki/Bromium, pp. 1-4.
Xen, "Dom0" downloaded Jun. 6, 2016 from http://wiki.xen.org/wiki/Dom0, last updated Mar. 29, 2015, pp. 1-2.
Amazon Web Services, "Amazon Elastic Compute Cloud: User Guide for Linux Instances," Latest Version update 2015, pp. 1-816.
IBM, General Information, Version 4, Release 3.0, Fifth Edition, Apr. 2002, pp. 1-101.

(56) References Cited

OTHER PUBLICATIONS

From Wikipedia, the free encyclopedia, "Hypervisor," downloaded Jun. 6, 2016 from https://en.wikipedia.org/wiki/Hypervisor, pp. 1-7.
Axel Buecker, et al., "Reduce Risk and Improve Security on IBM Mainframes: vol. 1 Architecture and Platform Security," Redbooks, IBM, Dec. 2014, pp. 1-308.
From Wikipedia, the free encyclopedia, "VMware ESX," downloaded Jun. 6, 2016 from https://en.wikipedia.org/wiki/VMware_ESX, pp. 1-13.
From Wikipedia, the free encyclopedia, "Xen," downloaded from Jun. 6, 2016 from https://en.wikipedia.org/wiki/Xen, pp. 1-12.
Udo Steinberg, et al., "NOVA: A Microhypervisor-Based Secure Virtualization Architecture", ACM, EuroSys'10, Apr. 13-16, 2010, pp. 209-222.
Sangster, et al., TCG Published, Virtualized Trusted Platform Architecture Specification, Specification Version 1.0, Revision 0.26, Sep. 27, 2011, pp. 1-60.
Network Functions Virtualisation (NFV); NFV Security; Security and Trust Guidance, ETSI GS NFV-SEC 003, V1.1.2, downloaded by EP on Jun. 4, 2016, pp. 1-57.
Cong Xu, et al., "vSlicer: Latency-Aware Virtual Machine Scheduling via Differentiated-Frequency CPU Slicing", Purdue University, Purdue e-Pubs, 2012, pp. 1-14.
Amazon Web Services, "Amazon Elastic Compute Cloud: User Guide for Linux Instances," Latest Version update 2018, pp. 1-884.
Amazon Web Services, "Amazon Elastic Container Service: Developer Guide" API Version, Nov. 13, 2014, pp. 1-386.
Amazon Web Services, "AWS Lambda: Developer Guide" 2018, pp. 1-539.
AWS, "Annoucing Amazon EC2 Bare Metal Instances (Preview)", Retrieved from URL: https://aws.amazon.com/about-aws/whats-new/2017/11/announcing-amazon-ec2-bare-metal-instances-preview/ on Jan. 15, 2018, pp. 1-4.
Brendan Gregg's Blog, "AWS EC@ Virtualization 2017: Introducing Nitro", Retrieved from URL: http://www.brendangregg.com/blog/2017-11-29/aws-ec2-virtualization-2017.html, pp. 1-11.
U.S. Appl. No. 16/196,723, filed Nov. 20, 2018, Anthony Nicholas Liguori.
U.S. Appl. No. 16/196,736, filed Nov. 20, 2018, Anthony Nicholas Liguori.

\* cited by examiner

Example virtualization management software components 420 run at PVMD cores/processors

- Embedded operating system 425
- Network interface card (NIC) emulators 429
- Legacy device emulators 433
- Block-device storage managers 437 (e.g., for configuring root volume of compute instance)
- NVME device emulators 439
- IVN data plane connectivity managers 441 (e.g., performing encapsulation protocol operations, mapping service calls, etc.)
- Instance metadata service agents 449
- Virtualized computing service control plane agents 453
- Virtualized computing service extension manager (EM) 457
- Network security agents 461 (e.g., DNS request loggers)

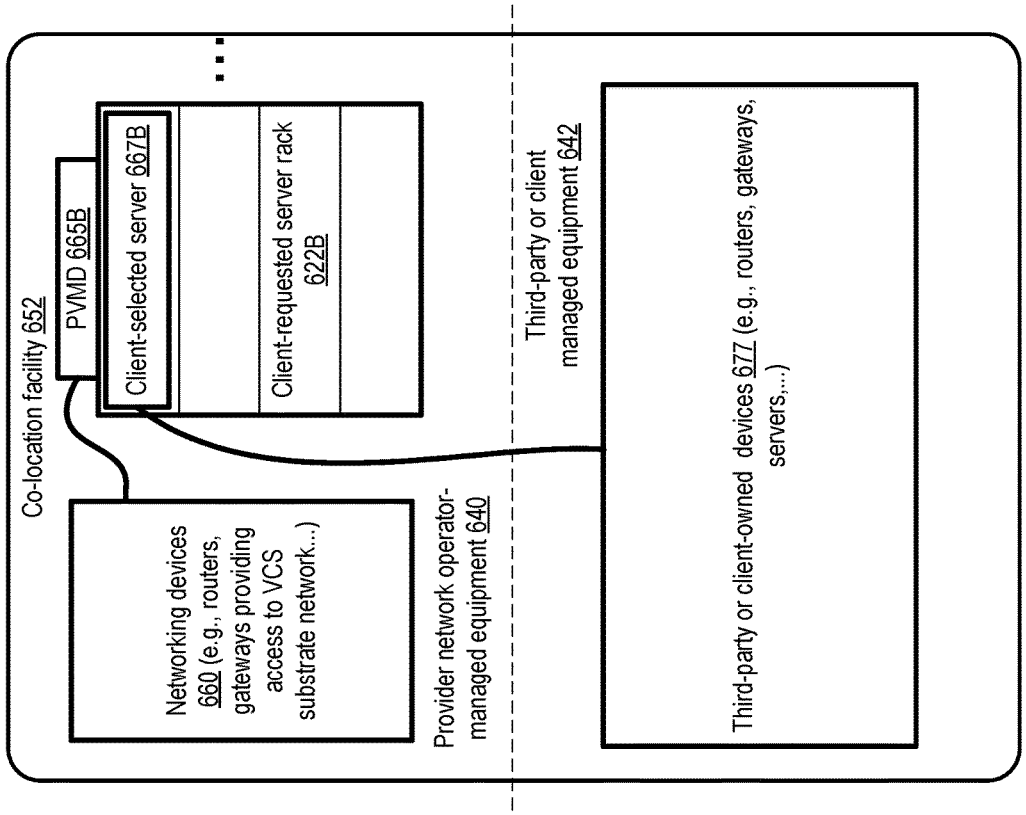
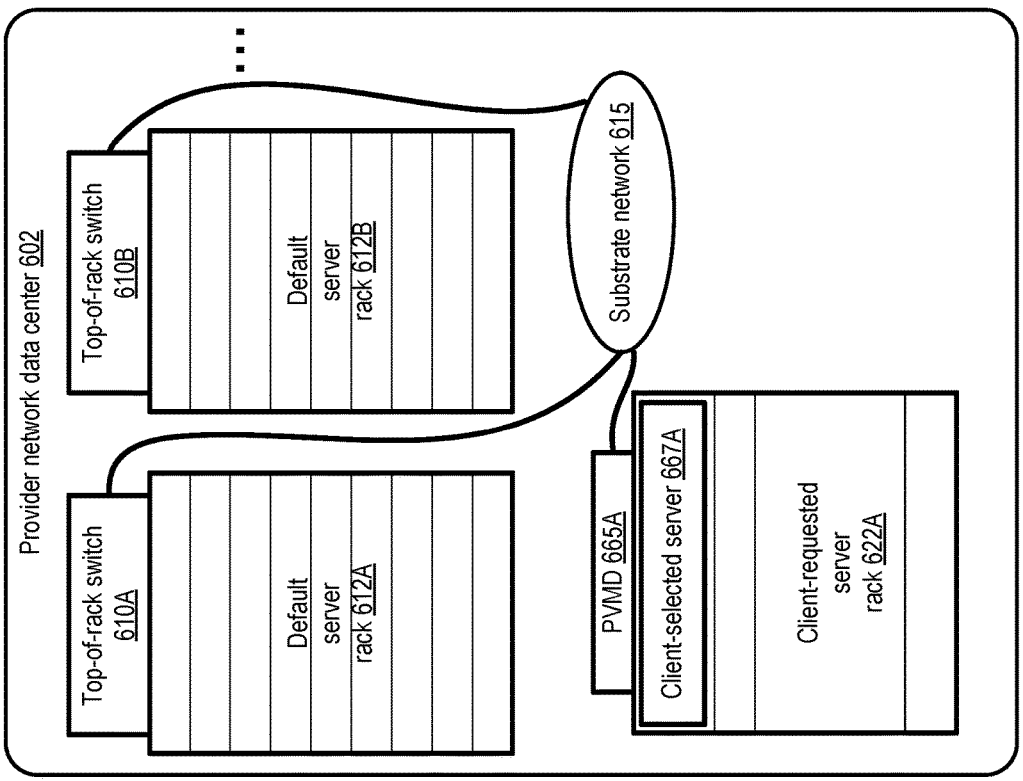
FIG. 6

US 11,520,530 B2

PERIPHERAL DEVICE FOR CONFIGURING COMPUTE INSTANCES AT CLIENT-SELECTED SERVERS

BACKGROUND

Many companies and other organizations operate computer networks that interconnect numerous computing systems to support their operations, such as with the computing systems being co-located (e.g., as part of a local network) or instead located in multiple distinct geographical locations (e.g., connected via one or more private or public intermediate networks). For example, data centers housing significant numbers of interconnected computing systems have become commonplace, such as private data centers that are operated by and on behalf of a single organization, and public data centers that are operated by entities as businesses to provide computing resources to customers. Some public data center operators provide network access, power, and secure installation facilities for hardware owned by various customers, while other public data center operators provide "full service" facilities that also include hardware resources made available for use by their customers.

The advent of virtualization technologies for commodity hardware has provided benefits with respect to managing large-scale computing resources for many customers with diverse needs, allowing various computing resources to be efficiently and securely shared by multiple customers. For example, virtualization technologies may allow a single physical virtualization host to be shared among multiple users by providing each user with one or more compute instances (such as "guest" virtual machines) hosted by the single virtualization host. Each such compute instance may represent a software simulation acting as a distinct logical computing system that provides users with the illusion that they are the sole operators of a given hardware computing resource, while also providing application isolation and security among the various virtual machines. Instantiating several different compute instances on the same host may also help increase the overall hardware utilization levels at a data center, leading to higher returns on investment.

A wide variety of compute instance types, suitable for different types of applications such as compute-intensive applications, memory-intensive applications, and the like may be set up at the data centers of some cloud computing provider networks in response to client requests. The operators of the provider networks may select the underlying virtualization servers which are used for such compute instances. In addition, higher-level services that rely upon the virtualized computing services of such provider networks, such as some database services whose database instances are instantiated using compute instances of the virtual computing services, may also be made available to provider network clients.

BRIEF DESCRIPTION OF DRAWINGS

FIG. 4 illustrates example virtualization management software components which may be executed at a peripheral virtualization management device, according to at least some embodiments.

FIG. 6 illustrates example uses of a peripheral virtualization management device at provider network data centers and co-location facilities, according to at least some embodiments.

Figure 1:
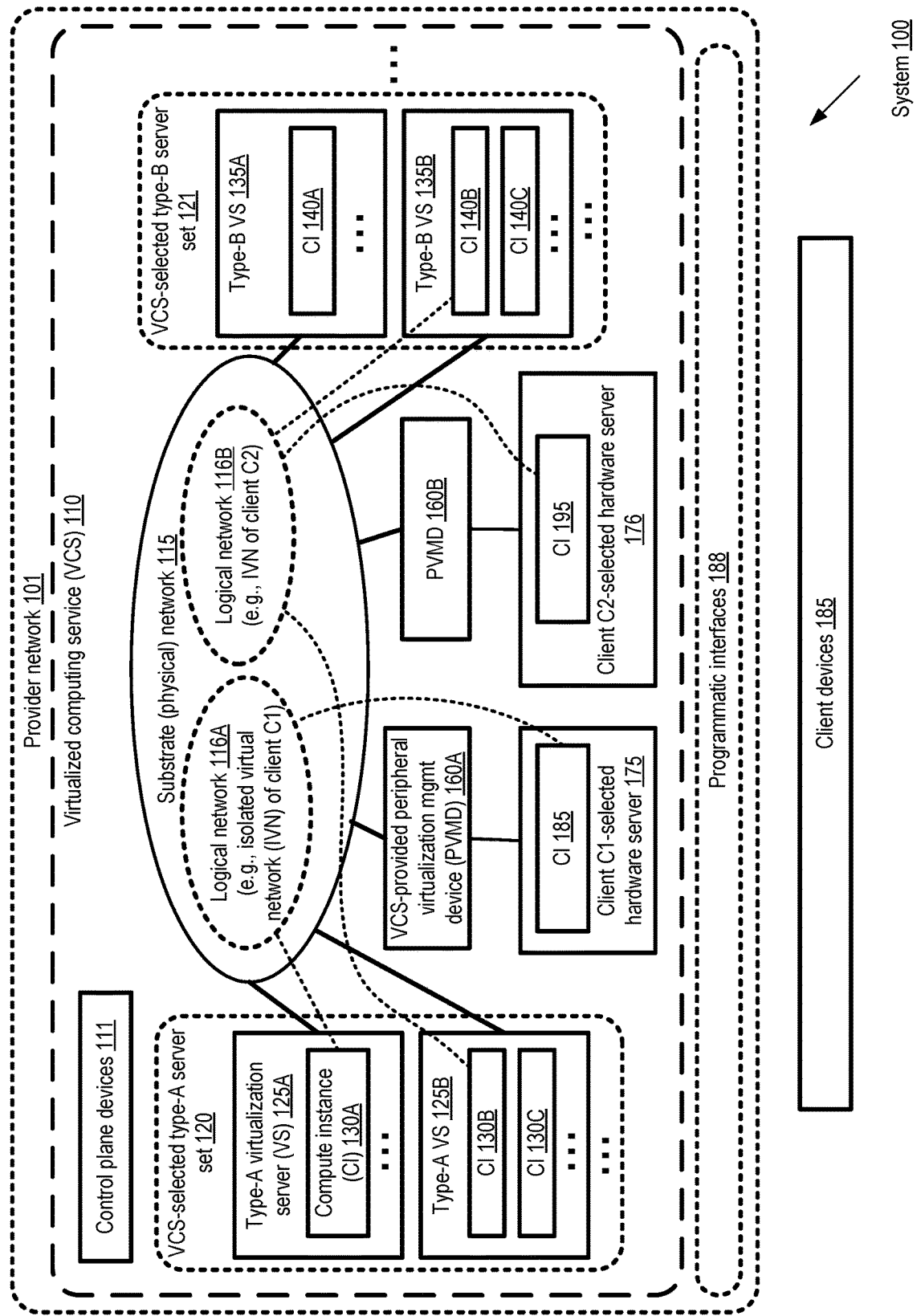
FIG. 1 illustrates an example system environment in which peripheral devices connected to a substrate physical network of a virtualized computing service may be employed to enable compute instances to be configured at client-selected servers, according to at least some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and apparatus for configuring compute instances of a virtualized computing service, such as a cloud provider network, on client-selected hardware servers using external peripheral devices connected to the servers (as opposed to the default practice of setting up compute instances at hardware servers that are selected by the operator of the virtualized computing service). The peripheral devices can be situated within enclosures or cases that are separate from the client-selected hardware servers, and may be ordered and shipped independently of the client-selected hardware servers. Clients of a virtualized computing service (VCS) may wish to configure compute instances at such servers (instead of only at the servers selected by the VCS operator) for a variety of reasons—e.g., because the servers include components (such as high-end processors/cores, extremely large storage devices, or custom networking components) that are customized for the clients' specialized applications, because software licenses are tied to the client-selected servers and cannot easily be transferred to servers owned by the VCS operator, and so on. However, typically such clients would have to select from among the hardware maintained by the VCS operator. A VCS operator may typically include large numbers of the same types of servers in its fleet for ease of maintenance, and thus customers requiring specialized hardware may be unable to use compute instances or other services of the VCS on their desired hardware. A VCS may be among a plurality of network-accessible services (e.g., including storage services, database services, etc.) implemented at a cloud provider network or cloud computing environment. The client-selected hardware servers (also referred to as customer-selected hardware servers or target hardware servers) can be located at the data centers of such a provider network, at co-location facilities (e.g., a location such as a building or room in which computing-related resources of more than one organization may be hosted), and/or at client-owned premises. Accordingly, the disclosed technology beneficially enables the usage of VCS services and resources on a wider range of hardware types (including specialized hardware that would not otherwise be incorporated into the VCS fleet) and/or in untraditional locations.

The peripheral devices, which can be supplied by the operator of the virtualized computing service in at least some embodiments, can each comprise various elements of hardware (e.g., including processors/cores, memories, storage devices, circuitry for power management, security management and the like) and software that collectively implement network and storage virtualization management, provide access to storage volumes via block-device interfaces, and incorporate the compute instances within isolated virtual networks (IVNs) or other logical networks set up for the client at the VCS. The peripheral device can be packaged within a small enclosure that can fit on top of, or within an empty slot, of an industry-standard server rack, and may be connectable to the hardware servers and networks using industry-standard components and connectors. In effect, as long as the client selects a hardware server that adheres to widely used industry standards for peripheral connectivity (such as Peripheral Component Interconnect-Express (PCIe) or Universal Serial Bus (USB)), the functionality incorporated within the peripheral device may allow compute instances launched at the hardware server to obtain all the benefits (e.g., manageability, security, connectivity to other network-accessible services, and the like) provided to compute instances set up at the fleet of servers selected by the operator of the VCS. The compute instances set up at servers selected by the operators of the VCS may be referred to as default-fleet (DF) compute instances, while the compute instances set up at the servers selected by the clients of the VCS may be referred to as client-fleet (CF) compute instances.

In various embodiments, the VCS may comprise a physical network, referred to as a substrate network, to which hardware servers used for the DF compute instances, as well as various other devices (such as networking intermediary devices including routers, switches, gateways and the like) may be connected. Utilizing the substrate network as underlying infrastructure, logical networks may be configured in such embodiments on behalf of various VCS clients. For example, a set of compute instances (including virtual machines, bare-metal instances that allow un-virtualized access to at least some hardware components of the underlying servers, etc.) may be configured on behalf of client C1 within a logical network called an isolated virtual network IVN1, while another set of compute instances may be configured on behalf of a different client C2 within another isolated virtual network IVN2. An IVN may comprise a collection of networked resources (including compute instances) assigned or allocated to a given client, which are logically isolated from (and by default, inaccessible from) resources allocated for other clients in other isolated virtual networks. The client on whose behalf an IVN is established may be granted substantial flexibility regarding network configuration for the resources of the IVN—e.g., private IP addresses for compute instances may be selected by the client without having to consider the possibility that other resources within other IVNs may have been assigned the same IP addresses, subnets of the client's choice may be established within the IVN, security rules may be set up by the client for incoming and outgoing traffic with respect to the IVN, and so on. Furthermore, in at least some embodiments, custom network endpoints may be set up within IVNs to enable compute instances of the IVN to communicate with network-accessible services of the provider network (such as storage services, database services, machine learning services, etc.) using private network pathways of the provider network, without having to traverse or use links or devices of the public Internet. In various embodiments, the network addresses assigned to compute instances within an IVN may differ from the substrate network addresses assigned to the hardware servers on which the compute instances run. An encapsulation protocol and associated mapping service may be used to route the flows of network traffic within and across the IVNs (e.g., from one compute instance to another, between client devices external to the VCS and the compute instances, or between compute instances and other provider network services) over the links and servers of the underlying substrate network in various embodiments. The VCS may also comprise a set of administrative or data plane components in various embodiments, responsible for tasks such as provisioning hardware, monitoring other resources, receiving and processing instance configuration commands from clients, and so on.

The peripheral devices used to configure compute instances at client-selected servers may be referred to as peripheral virtualization management devices (PVMDs) in at least some embodiments. PVMDs may be configurable to execute different combinations of software/firmware, and thus support different combinations of virtualization-related functionality, depending on the specific needs of the clients on whose behalf compute instances are to be set up at client-selected hardware servers in various embodiments. In some cases, for example, clients may wish to launch their compute instances at premises (such as data centers of the provider network at which the VCS is implemented, or some types of co-location facilities) with direct physical connectivity to the substrate network of the VCS. In such premises, the PVMDs may be physically connected via one or more cables (e.g., an Ethernet cable) to the substrate network, without requiring traffic between the PVMDs and the substrate network to have to flow over any network links that are not managed/controlled by the VCS operator. When utilized at these types of premises, the PVMDs may be said to run in "direct substrate connectivity" (DSC) mode, and a first set of virtualization-related software may be executed at the PVMDs. Configuration operations pertaining to compute instances launched at the target hardware server connected to the PVMD in DSC mode may be implemented by the PVMD, e.g., in response to commands submitted to the VCS control plane by clients in various embodiments. Software running at the PVMD may implement the VCS's encapsulation protocol, used for routing traffic to and from the compute instances over the substrate network, in such embodiments.

In other cases, clients may wish to utilize PVMDs for setting up compute instances at client-selected hardware servers located at premises where direct physical access to the VCS substrate network is not available, e.g., at client-owned data centers, client organization office facilities and the like. While some co-location facilities may provide direct access to the substrate network, other co-location facilities may not, and this latter type of co-location facility may also be used for client-selected hardware servers at which PVMD-enabled compute instances are run in at least some embodiments. In effect, in such scenarios, clients may wish to logically extend the VCS beyond the data centers of the provider network. When utilized for this purpose, the PVMDs may be said to run in "extension premise" (EP) mode, and may run software which includes a VCS extension manager (EM) in at least some embodiments. Note that when used in EP mode, a PVMD may also run all (or at least most of) the software that is run in DSC mode. Using the described techniques, in at least some embodiments clients of a virtualized computing services may be able to utilize the selected hardware devices, located at premises external to the provider network, to host compute instances with the same features and capabilities as at least some of the types of compute instances that can be set up at the provider network data centers.

As one skilled in the art will appreciate in light of this disclosure, certain embodiments may be capable of achieving various advantages, including some or all of the following: (a) enabling a wide variety of virtualized computing applications to be implemented in a hardware-agnostic and location-independent manner, e.g., using hardware servers chosen by clients while still retaining the operational advantages (such as manageability/monitoring, connectivity to other provider network services, etc.) made possible by using a provider network, (b) reducing the amount of application data and results that have to be transferred over long distances, such as over links between customer data centers and provider network data centers, (c) improving the overall latencies and responsiveness of applications for which potentially large amounts of data may be consumed as input or produced as output, by moving the applications close to the data sources/destinations, and/or (d) improving the security of sensitive application data. In various embodiments, guiding principles and goals underlying the design and implementation of PVMDs used for enabling compute instances at client-selected hardware servers may include, among others: (a) using industry standards-compliant connectivity technologies and protocols, (b) utilizing PVMD enclosures with small form factors, such that a PVMD has minimal space, cooling and other physical requirements, (c) ensuring customer data security by restricting and thoroughly logging network traffic, and providing physical mechanisms (such as physical keys) to ensure that the data stored on the PVMD's storage devices cannot be stolen, (d) providing first-class support for a variety of provider network services (equivalent to the support possible using resource located in the provider network data centers), (e) protecting the provider network's own data centers from potential hostile actors (e.g., operating from a premise at which a PVMD is installed), and/or (f) supporting continued fulfilment of services at servers connected to PVMDs even under conditions of imperfect network connectivity.

According to some embodiments, a system may comprise one or more computing devices of a control plane of a VCS of a provider network, a target hardware server (THS) indicated by a client of the provider network, and a peripheral device (e.g., a PVMD) located within a physical enclosure external to the target hardware server. The term "target" may be applied to the client-selected hardware server as it is the resource at which operations initiated by the PVMD are targeted. The PVMD may include, among other elements, one or more processors and a memory storing program instructions. In some embodiments, the processors and/or memory may be incorporated within one or more SOCs (systems on chip). When executed at or across the one or more processors of the PVMD, the program instructions of the PVMD may implement one or more virtualization management offloading components, including one or more storage managers and one or more networking managers in some embodiments. The PVMD may establish connectivity with a substrate network of the VCS via a first cable in some embodiments, or detect that such connectivity has been established; accordingly, the PVMD may operate in DSC (direct substrate connectivity) mode in such embodiments. Connectivity among one or more logical networks of the VCS (such as IVNs similar to those introduced earlier) may be enabled using an encapsulation protocol implemented at a plurality of devices attached to the substrate network in at least some embodiments. Subsequent to detecting that (a) a peripheral card of the THS has been linked via a second cable to an external peripheral port of the peripheral device, and (b) a system management service processor of the THS has been linked via a third cable to the peripheral device, the peripheral device may cause the control plane of the VCS to present the THS to the client as a virtualization server selectable by the client to run one or more compute instances in at least some embodiments. Thus, the THS may be linked to the PVMD via a peripheral card (e.g., a PCIe card) that fits into a THS slot, as well as via a system management service processor (e.g., a baseboard management controller or BMC) of the THS in such embodiments. The THS may be linked to the substrate network only via the peripheral device in various embodiments; in effect, the peripheral device, which may have been designed and provided by the operator of the VCS, may act as a gatekeeper or security intermediary between the THS (selected by the client) and the substrate network. As part of the operations performed to enable the THS to be presented as a virtualization server, in at least some embodiments a network address of the VCS substrate network (i.e., a network address selected from a range of addresses assigned to virtualization hosts linked to the substrate network) may be assigned to the THS. The terms "virtualization server" and "virtualization host" may be used synonymously herein to refer to a hardware server on which one or more compute instances of a VCS can be executed or run.

In at least some embodiments, the VCS may offer its clients the ability to set up compute instances in either multi-tenant mode (in which a given hardware server may be used to launch and run compute instances of several different clients) or in single-tenant mode (in which a given hardware server may be used to launch and run compute instances of no more than one client). One of the single-tenant options may include allocating a client a virtualization server designated as a "dedicated virtualization host", enabling the client to specify/identify the virtualization server as the resource to be used for one or more compute instances without sharing the host with other clients, and enabling the client to use server-based software licenses (e.g., per-hardware-socket, per-core, or per-virtual-machine) license. In some embodiments, when a PVMD is connected to a client-selected THS as described above, the PVMD may cause the VCS control plane to present the THS as such a dedicated virtualization host. For example, information about the newly-connected THS may be transmitted from the PVMD to the VCS control plane (e.g., via the VCS substrate network), and the VCS control plane may add the THS to its database of dedicated virtualization hosts, assign a substrate network address to the THS, and include the THS in a list of dedicated virtualization hosts presented to the client on whose behalf the PVMD is being used.

The PVMD may initiate one or more configuration operations of a compute instance at the THS on behalf of the client in various embodiments, including for example launching the compute instance, changing networking or other configuration settings, terminating the instance, and so on. In at least one embodiment, a bare metal compute instance may be instantiated at the THS on behalf of the client via the PVMD, enabling un-virtualized access to at least some of the THS's hardware devices/components. In some embodiments, multiple compute instances may be set up at the THS via the PVMD. In one embodiment, a single PVMD may be used to set up respective compute instances at more than one client-selected server connected to that PVMD. In various embodiments, a compute instance of a THS may be configured within an isolated virtual network of the provider network based at least in part on operations performed using the one or more networking managers running at the PVMD. Such networking managers may, for example, store an indication of a network address (within a range of private network addresses of an isolated virtual network established at the virtualized computing service) which has been assigned to a compute instance configured at the THS, and/or may assign such an address to a virtual network interface programmatically attached to such a compute instance. In one embodiment, a compute instance of a THS provided access to a root volume (and/or other logical storage devices, file systems, and the like) based at least in part on operations performed by the one or more storage managers running at the PVMD. For example, in some embodiments the storage managers may set up, modify, or otherwise configure the root volume using a block-storage service of the provider network, and/or other logical storage devices, file systems and the like. In some embodiments, the PVMD may comprise one or more persistent storage devices (e.g., devices accessible via an NVME (non-volatile memory express) interface) at which the contents of the root volume and/or other storage objects accessed from the compute instances of the THS may be stored.

In some embodiments the PVMD may be connected to the THS via one or more PCIe connectors. In other embodiments, a connector configured to multiplex PCIe signals with other types of signals (such as a connector that multiplexes PCIe signals with DisplayPort signals) may be used, and/or a USB (Universal Serial Bus) connector may be used. In one embodiment, a signal repeater card or a signal re-timer card (such as a PCIe re-timer card or repeater card) may be inserted into a slot of the THS and linked via a cable to the PVMD. In other embodiments, such a signal repeater or re-timer card may not be required.

According to at least one embodiment, the networking managers of the PVMD may include a network interface card (NIC) emulator and/or an IVN connectivity manager. Encapsulation/de-capsulation operations of the encapsulation protocol of the VCS may be implemented at the networking managers in some embodiments, e.g., for packets directed from a client-fleet (CF) compute instance within a particular IVN to a default-fleet (DF) compute instance running at the same IVN or a different IVN. In at least one embodiment, the networking managers of the PVMD may be configured to log various types of network traffic directed to and/or from the CF compute instance(s), e.g., including Domain Name Service traffic directed to DNS servers in or outside the provider network, and provide such logs via programmatic interfaces to the client on whose behalf the CF compute instance is configured. A number of programmatic interfaces (e.g., web-based consoles, command-line tools, graphical user interfaces, application programming interfaces (APIs) and the like) may be implemented by the VCS to enable clients to submit requests pertaining to PVMD-enabled compute instances in various embodiments and receive corresponding responses. For example, a client may submit a programmatic request to enable a THS to host one or more compute instances via a PVMD, and the PVMD may be connected to the substrate and to the THS (e.g., within a provider network data center or a co-location facility) in response to such a request.

In one embodiment, the PVMD may comprise a persistent storage device as well as an associated removable cryptographic storage security device (such as a physical key, accessible from the font face of the PVMD enclosure) which can be physically detached/separated from the PVMD. A removal of the cryptographic storage security device may render the contents of the persistent storage device unreadable/un-writeable in such an embodiment—that is, the security device may have to be physically present to allow the contents of the persistent storage device to be read or written.

According to at least one embodiment, the PVMD may comprise one or more small form factor pluggable (SFP) ports. Such ports may be used to establish connectivity with the VCS substrate network and/or other networks. In one embodiment, the PVMD may be installed in a 1-U (one unit) slot/tray of a server rack (such as a server rack which also houses the THS).

In some embodiments, PVMDs may be used in extension premise (EP) mode, i.e., at client-owned or other third-party premises where it is not possible to connect a PVMD with the VCS substrate directly (e.g., via one or more cables) as is possible at provider network data centers or some co-location facilities where the PVMDs can be run in the DSC (direct substrate connectivity) mode. According to one such embodiment, a system may comprise one or more computing devices of a VCS of a provider network (located within one or more data centers of the provider network, a target hardware server (THS) located at a premise external to the one or more data centers, and a PVMD located at the premise within a physical enclosure separate from the THS. The PVMD may comprise program instructions that when executed at or across one or more processors of the PVMD implement an extension manager (EM) of the VCS. The EM may be configured to establish connectivity with one or more extension traffic intermediaries (ETIs) of the VCS via one or more secure channels in some embodiments. The ETIs may be implemented at the one or more computing devices within the provider network data centers. The ETIs may be configured to perform security operations with respect to traffic between the external premise at which the PVMD is located and the one or more data centers of the provider network in various embodiments.

After a determination is made that a peripheral card of the THS has been linked to the PVMD (e.g., via an external peripheral port of the PVMD), the EM may assign a particular private network address of the substrate network of the VCS to the THS in some embodiments, and cause the THS to be presented as a virtualization host of the VCS. The particular private network address assigned to the THS may also be assigned to one of the ETIs in at least some embodiments, thus enabling the ETI to act as a substitute (from a networking perspective) of the THS within the VCS substrate network. In such a configuration in which common addresses are assigned to the THS and the ETI, messages to be sent to the THS from within the substrate (e.g., messages originating at default-fleet compute instances, or from the VCS control plane) may initially be sent to the ETI instead. The messages may then transferred over the secure paths to the EM, and from the EM to the THS (e.g., to a compute instance launched at the THS, or to a control plane agent running at the THS). In response to an indication, received at the EM from the ETIs, that a programmatic request has been submitted to the VCS by a client, the EM may cause one or more configuration operations of a compute instance to be performed at the THS (e.g., including launching/terminating the instance, setting networking properties, and so on). The programmatic request from the client may have been submitted using a pathway which does not include the one or more secure channels set up between the PVMD and the ETIs in at least one embodiment. In such embodiments, the secure channels may be configured as one-way pathways for commands from the VCS control plane to the PVMD/THS combination, and may not be usable to submit commands to the VCS control plane. Data plane message traffic may, however, be permitted in both directions between the PVMD and the VCS data centers in at least some embodiments.

From the perspective of the VCS clients on whose behalf the PVMD is configured and used, the same kinds of compute instance-related functionality may be supported at the THS regardless of whether the PVMD-and-THS combination is run at premises away from the data centers of the VCS, or at the provider network data centers in at least some embodiments. In effect, the PVMD, when configured to run an EM, may extend the VCS data plane into the external premises. A compute instance launched at the THS may be configured within an IVN of the VCS, for example; that is, a network address from a range of addresses of the client's IVN may be assigned to the compute instance. The PVMD may also act as a bridge between the VCS and other networks (e.g., networks established by the client at the external premise), performing encapsulation, address translation and other operations to enable packets to flow to and from the compute instances of the VCS and devices configured in the other networks.

In some embodiments, respective compute instances running at several THSs at a premise external to the provider network may be configured as part of the same logical network—e.g., as part of the same IVN, or even the same subnet within an IVN. In such scenarios, secure communication channels or tunnels may be established between the respective PVMDs linked to the THSs located at the premise, so that network packets can flow securely among the instances using the physical network links and devices available at the premise.

According to some embodiments, as mentioned earlier the provider network of the VCS may implement one or more other services, such as a database service or an object storage service, which can be accessed from at least some compute instances of the VCS using credentials assigned to the compute instances by an instance metadata service (IMDS) of the VCS. Such an IMDS may also provide other metadata elements to compute instances, including a unique identifier assigned by the VCS to the compute instance, an identifier of a machine image used for the compute instance (if any), block device mappings information of the instance, and so on. In some embodiments, the metadata may be accessed from the compute instance via a link-local HTTP (HyperText Transfer Protocol) address accessible only from within the instance itself. In at least one embodiment, an agent of the IMDS may be run at a PVMD, and such metadata (including the credentials usable to access other provider network services from the compute instance) may be provided by the agent.

In some embodiments, as mentioned earlier, private service endpoints (PSEs) may be set up within an IVN, e.g., to enable network traffic to flow between compute instances of the IVN and other publicly-accessible provider network services without using the public Internet. In at least one such embodiments, clients may define and associate various types of policies with such PSEs—e.g., a policy may indicate that only instances CI1, CI2 and CI3 of an IVN are permitted to use an endpoint PSE1 to access a particular storage object SO1 at a storage service SS1. Compute instances set up at a THS at a client-owned premise may also utilize such PSEs and associated policies in at least some embodiments. For example, different policies may be defined and enforced with respect to the access granted to a compute instance running at a client-owned premise, relative to the access granted to a compute instance which is established within a data center of the provider network on behalf of the same client.

In at least one embodiment, a plurality of THSs may be set up with PVMDs at respective external premises, and a logical network (such as an IVN) that spans the different premises may be configured. Thus, in such an embodiment, compute instances CI1 (run at a PVMD-connected THS THS1 at an external premise EP1), CI2 (run at a PVMD-connected THS THS2 at a second external premise EP2), and CI3 (run at a PVMD-connected THS THS2 at a second external premise EP2) may all be configured within the same IVN. CI1, CI2 and CI3 may be set up within respective subnets of the IVN in some embodiments if desired.

Note that from a hardware perspective, in at least some embodiments, the PVMDs used at external premises (where direct connectivity to the VCS substrate network is not feasible) may be identical to the PVMDs used at provider network data centers or some types of co-location facilities (where the PVMDs are connected physically to the substrate network). From the perspective of the features and functionality for compute instance configuration and use, the PVMDs in extension premise (EP) mode (i.e., with extension managers) may offer at least some additional functionality beyond the functionality supported in direct substrate connectivity (DSC) mode. Such additional functionality may include the ability to communicate, with the help of an extension manager, between the compute instances (set up with the help of the PVMD) and non-VCS devices within networks set up at the external premise in at least some embodiments. In at least some embodiments, if a VCS compute instance of a particular category (e.g., a bare metal compute instance) can be set and managed using a PVMD within a provider network data center, a compute instance of the same category may also be configured with the help of the PVMD at a premise external to the data center.

Example System Environment with Direct Substrate Connectivity

FIG. 1 illustrates an example system environment in which peripheral devices connected to a substrate physical network of a virtualized computing service may be employed to enable compute instances to be configured at client-selected servers, according to at least some embodiments. As shown, system 100 includes resources and artifacts of a virtualized computing service (VCS) 110 of a provider network 101. Networks set up by an entity such as a company or a public sector organization to provide one or more network-accessible services (such as various types of cloud-based computing, storage or analytics services) accessible via the Internet and/or other networks to a distributed set of clients may be termed provider networks (or cloud provider networks) in some embodiments. A provider network may sometimes be referred to as a "public cloud" environment (sometimes referred to simply as a "cloud"), which refers to a large pool of network-accessible computing resources (such as compute, storage, and networking resources, applications, and services), which may be virtualized or bare-metal. The cloud can provide convenient, on-demand network access to a shared pool of configurable computing resources that can be programmatically provisioned and released in response to customer commands. These resources can be dynamically provisioned and reconfigured to adjust to variable load.

The resources of a provider network may in some cases be distributed across multiple data centers, which in turn may be distributed among numerous geographical regions (e.g., with each region corresponding to one or more cities, states or countries). For example, a cloud provider network can be formed as a number of regions, where a region is a geographical area in which the cloud provider clusters data centers. Each region can include two or more availability zones connected to one another via a private high speed network, for example a fiber communication connection. An availability zone refers to an isolated failure domain including one or more data center facilities with separate power, separate networking, and separate cooling from those in another availability zone. Preferably, availability zones within a region are positioned far enough away from one other that the same natural disaster should not take more than one availability zone offline at the same time. Customers can connect to availability zones of the cloud provider network via a publicly accessible network (e.g., the Internet, a cellular communication network).

The VCS 110 may implement one or more programmatic interfaces 188 which can be used by clients to submit programmatic requests from client devices 185 (such as laptops, desktops, mobile computing devices etc.), including for example requests to launch, terminate, or reconfigure compute instances 130 such as virtual machines, bare metal instances and the like. A bare metal instance may access at least some un-virtualized hardware components of the virtualization server at which the bare metal instance is run. Programmatic interfaces 188 may include, for example, one or more web-based consoles, command-line tools, graphical user interfaces, APIs, and the like. The requests submitted by VCS clients may be directed to a set of control plane devices 111 of the VCS, which may in turn cause corresponding internal requests or commands to be implemented at various other components of the VCS. The control plane of the VCS may be responsible primarily for administrative or configuration tasks, while the data plane (which may include the compute instances 130 run at VCS-selected virtualization servers 125 as well as client-selected hardware servers 175 or 176) may be used primarily for client applications and data.

In the embodiment depicted in FIG. 1, a variety of hardware servers may be used to set up compute instances 130 on behalf of VCS clients. The operator of the VCS 110 may, for example, set up racks containing standardized servers of various categories at one or more data centers, such as VCS-selected type-A server set 120 and type-B server set 121. The VCS-selected virtualization servers may differ from one another in compute power, memory or storage capacity, and so on—thus, for example, Type-A virtualization servers 125A (such as VS 125A or 125B) may have more or faster CPUs/cores than Type-B virtualization servers 135 (e.g., 135A or 135B), while Type-B virtualization servers 135 may have more local storage than Type-B virtualization servers. Compute instances (CIs) of various categories, such as CIs 130A, 130B, 130C, 140A, 140B, or 140C may be launched at VCS-selected servers in response to client requests submitted to the control plane. Just as the underlying virtualization servers may differ in capabilities from VCS-selected set 120 to set 121, the compute instances launched at the servers of the different sets may also differ in capabilities—e.g., CIs 130 may be optimized for compute-intensive applications, while CIs 140 may be optimized for storage-intensive tasks. In some embodiments, a VCS may use only a single type of virtualization server by default, instead of Type-A servers, Type-B servers and the like.

The VCS 110 may comprise a physical network 115, to which virtualization servers may be connected in the depicted embodiment. Using the substrate network 115 as the physical infrastructure, a set of logical networks may be configured, such as 116A or 116B. Examples of logical networks may include isolated virtual networks (IVNs) established on behalf of VCS clients in at least some embodiments—for example logical network 116A may comprise an IVN of a client C1, while logical network 116B may comprise an IVN of a client C2 in the scenario depicted in FIG. 1. The compute instances 130 and 140 may be assigned network addresses of the logical networks in at least some embodiments. Thus, for example, CI 130A of virtualization server (VS) 125A may be configured within logical network 116A, while CI 140B of VS 135B may be configured within logical network 116B. To manage and route the network traffic directed to or from entities (such as compute instances 130 or 140) of the logical networks using the underlying substrate network to which the virtualization hosts are connected, a mapping service and/or an encapsulation protocol may be employed at the VCS 110, as discussed in further detail below with respect to FIG. 2.

Some clients of the VCS 110 may wish to set up and use compute instances at hardware servers other than those configured by default at the VCS in the depicted embodiment. The VCS 110 may allow at least some client-selected hardware servers (such as client C1-selected hardware server 175, or client C2-selected hardware server 176) to be used as virtualization hosts, as long as the client-selected hardware servers are connected to the VCS substrate network 115 via VCS-provider peripheral virtualization management devices (PVMDs) 160, such as PVMD 160A or 160B in the depicted embodiment. A PVMD 160 may be implemented within a separate enclosure or case than the client-selected hardware server to which it is physically connected in the depicted embodiment. In at least some embodiments, the PVMDs 160 may be provided by the VCS in response to programmatic requests submitted via programmatic interfaces 188. A PVMD may incorporate hardware, firmware and/or software components in some embodiments that perform networking and storage virtualization tasks required to establish compute instances (e.g., instances 185 or 195) at the client-selected hardware servers such as servers 175 or 176, while acting as a secure intermediary between the servers and the substrate network 115. The client-selected hardware servers 175 may differ from the VCS-selected servers along various dimensions—e.g., some client-selected hardware servers may have greater computational or storage capacity than the VCS-selected servers, include some specialized networking or storage hardware that is not available at the VCS-selected servers, or simply have server-specific software licenses that are required to run client applications and cannot be transferred to VCS-selected servers.

According to at least some embodiments, a PVMD may include program instructions that when executed at the PVMD's processors implement one or more networking managers and one or more storage managers. In one embodiment, a given PVMD 160 may establish connectivity, e.g., using respective connectors or cables, with (a) the VCS substrate network 115, (b) a peripheral card of a client-selected target hardware server such as 175 or 176 which is to be used to host at least one VCS compute instance, and (c) a system management service processor (e.g., a baseboard management controller or BMC) of the client-selected server. In one example implementation, connectivity to the substrate network may be established using an Ethernet cable (e.g., inserted into a small form-factor port (SFP) of the PVMD), connectivity to a re-timer card of the target hardware server may be established using PCIe or USB, and connectivity to the system management service processor may be established using an RJ45 connector. Other types of ports, cables and/or connectors may be used in other embodiments. After the PVMD detects that these three types of connectivity have been established successfully, in at least some embodiments the PVMD may cause the control plane devices 111 of the VCS to present the client-selected hardware server 175 or 176 as a virtualization host selectable by the client to run the compute instance(s). In some embodiments, the client-selected hardware server may be presented as a dedicated virtualization host at which only a single client's compute instances may be set up. In one embodiment, a given VCS client C1 may permit other VCS clients to set up compute instances at a C1-selected server connected to a PVMD.

After the client-selected hardware server has been designated and presented as a virtualization host, various types of compute instance configuration operations (such as operations to launch or terminate a compute instance or change configuration settings of the instance) may be performed at the server in the depicted embodiment, e.g., in response to requests submitted by clients via interfaces 188. A compute instance may be configured within a logical network (such as an IVN) with the help of operations performed at networking managers running at the PVMD, for example. In the scenario depicted in FIG. 1, compute instance 185 (e.g., a bare metal instance) may be launched at client-selected hardware server 175, and assigned a network address within logical network 116A, just as compute instance 130A of VCS-selected virtualization server 125A is assigned a network address within logical network 116A. Similarly, compute instance 195 may be launched at client-selected hardware server 176, and assigned a network address within logical network 116B, just as compute instance 130B of VCS-selected virtualization server 125B and compute instance 140B of virtualization server 135B were assigned respective network addresses within logical network 116B. The storage managers running at the PVMD may configure and provide access to a root volume for a compute instance 185 or 195, and/or to other logical storage devices, file systems and the like. In at least one embodiment, such root volumes and/or other logical storage devices may be configured using persistent storage devices (such as NVME devices) incorporated within the PVMD enclosure. The networking managers of the PVMDs may include, for example, NIC emulators, IVN connectivity managers and the like in one embodiment. The PVMDs may also include physical security devices in some embodiments, such as physical keys that render the storage devices of the PVMDs unusable if the physical keys are removed from the PVMD.

In some embodiments, a client-selected hardware server and a corresponding PVMD 160 may be placed within a data center of provider network 110, e.g., within the same standardized server rack such as a 19-inch width rack. In one implementation, a PVMD 160 may occupy a 1-U slot within such a rack, while the hardware server may occupy one or more other slots or positions within the rack. In one embodiment, a client-selected hardware server and its PVMD may be positioned within a co-location facility which has direct access to the VCS substrate network 115.

Various types of functionality supported for compute instances 130 or 140, such as the ability to log network traffic flows (including DNS requests and responses), the ability to perform intrusion detection and other types of security-related operations, and so on, may be supported transparently for compute instances 185 or 195 in at least some embodiments. Instance metadata, e.g., including credentials that enable a compute instance 185 or 195 to make authorized service requests to other services of the provider network 110, may be generated at a PVMD 160 and provided to the compute instance in some embodiments. Metrics (e.g., including resource utilization levels, network packet counts/drops etc.) may be collected for the compute instances launched at client-selected servers and provided to clients, just as they are for CIS 130 and 140, and so on.

Example Mapping and Encapsulation of Network Traffic for Logical Networks

Figure 2:
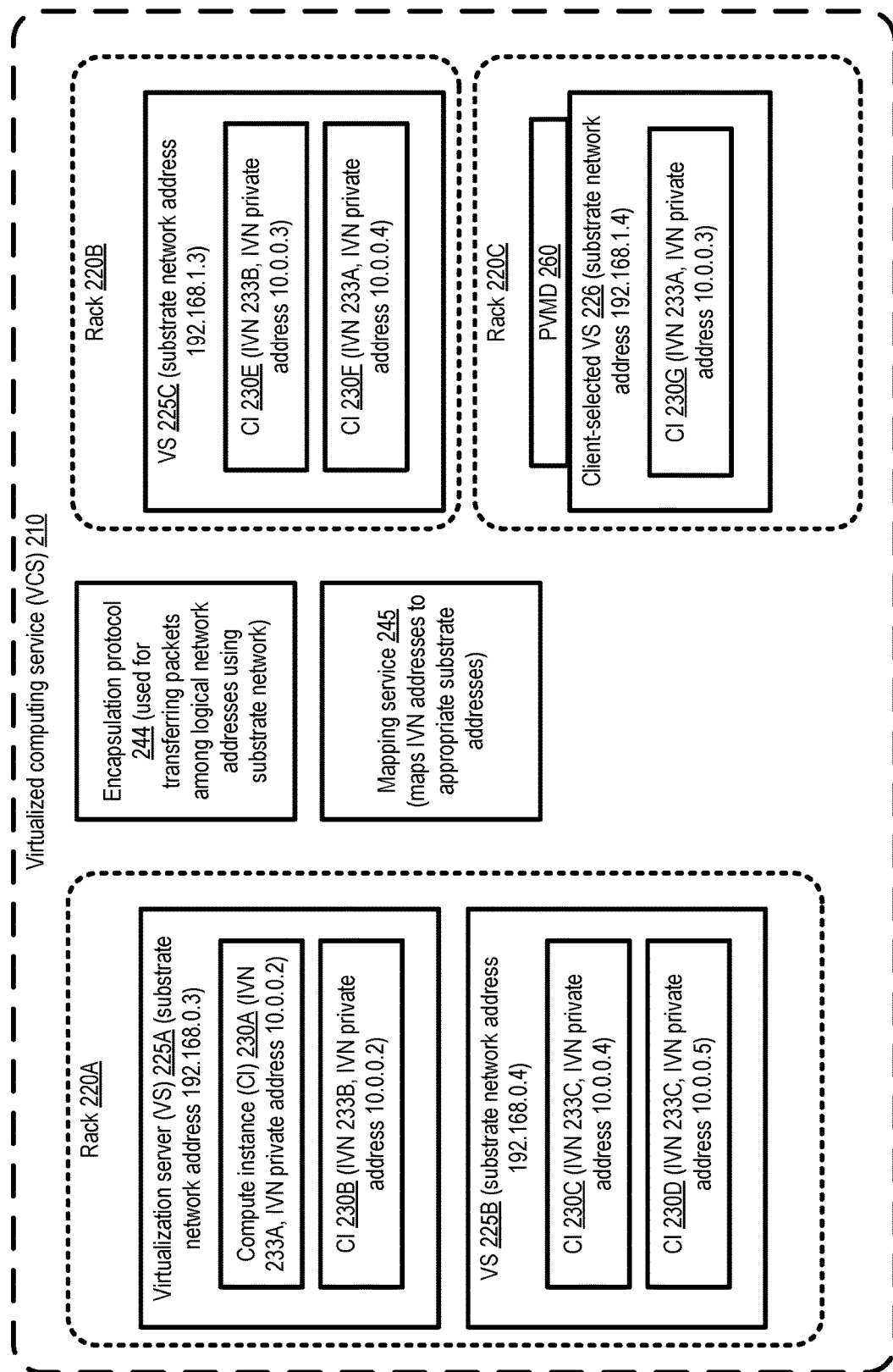
FIG. 2 illustrates an example of the use of a mapping service and an encapsulation protocol at a virtualized computing service at which logical networks are configured over a substrate network, according to at least some embodiments.

As mentioned earlier, in various embodiments a VCS may include logical networks configured using an underlying physical or substrate network, and PVMDs may be connected to such a substrate network to enable network communications of compute instances set up at client-selected servers. FIG. 2 illustrates an example of the use of a mapping service and an encapsulation protocol at a virtualized computing service at which logical networks are configured over a substrate network, according to at least some embodiments. The depicted scenario is presented to illustrate the kinds of networking-related operations that may have to be performed to enable traffic flows between compute instances set up within such logical networks; such operations are not restricted to environments in which PVMDs are used. IP (Internet Protocol) version 4 addresses are used by way of example in FIG. 1, although addresses formatted in accordance with other protocols such as IPv6 may be used in at least some embodiments. Note that the specific IP addresses shown in FIG. 2 are chosen as examples, and the PVMD-based techniques described herein are not limited to any specific addresses or address ranges.

In the depicted embodiment, three server racks 220A, 220B and 220C are shown, each comprising one or more virtualization servers used by the VCS 210. Rack 220A comprises virtualization server (VS) 225A and VS 225B, rack 220B comprises VS 225C and rack 220C comprises a client-selected virtualization server 226 connected to a PVMD 260. PVMD 260 may provide functionality and features similar to PVMDs 160 discussed in the context of FIG. 1. VSs 255A, 255B and 255C may each be connected to the substrate network of the VCS), e.g., via one or more Ethernet or similar cables linked to a top-of-rack switch configured within the substrate network. PVMD 260 may also be connected to the substrate network directly, e.g. using an Ethernet or similar cable. Client-selected VS 226 may be connected to the PVMD, e.g., via a PCIe or USB connector, but may not be directly connected to the substrate network itself; that is, the PVMD 260 may serve as an intermediary between the substrate network and the client-selected VS 226.

Each of the virtualization servers 225A, 225B, 225C and 226 may be assigned a substrate network address in the depicted embodiment, such as 192.168.0.3 for VS 225A, 192.168.0.4 for VS 225B, 192.168.1.3 for VS 225C, and 192.168.1.4 for client-selected virtualization server 226. The substrate address for server 226 may be obtained, e.g., from the VCS control plane, by the PVMD 260 in some embodiments.

Compute instances launched at the virtualization servers may be assigned network addresses within isolated virtual networks in the depicted embodiment. For example, CIs 230A (at VS 225A), 230F (at VS 225C), and 230G (at VS 226) may all be configured within the same IVN 233A, and assigned respective IVN private addresses 10.0.0.2, 10.0.0.4, and 10.0.0.3 respectively. Similarly, CIs 230B and 230E may be assigned IVN private addresses 10.0.0.2 and 10.0.0.3 within IVN 233B, and CIs 230C and 230D may be assigned IVN private addresses 10.0.0.4 and 10.0.0.6 within IVN 233C in the depicted example. Note that as indicated earlier, address ranges used within IVNs for private addresses assigned to the CIs may overlap with one another—thus, CIs 230A and 230B have the same private address 10.0.0.2 within distinct IVNs (233A and 233B). The within-IVN addresses may be deemed to be private in that they are not advertised or made accessible outside the IVNs, at least by default, in some embodiments. In at least some embodiments, the private addresses may be assigned to virtual network interfaces, and the virtual network interfaces may be programmatically attached or associated to the compute instances. In at least some embodiments, in contrast, at least some of the substrate addresses may be assigned to physical network interface cards or NICs (or to NIC emulators), e.g., at the virtualization servers or the PVMD 260.

In order to transmit network packets that originate at one CI to another CI, three types of network information may have to be considered in the depicted embodiment: the IVN private addresses of the source and destination, the IVNs to which the sources and destinations belong, and the substrate addresses of the underlying virtualization servers. For example, a packet originating at CI 230A and destined for CI 230G may indicate its source (private) address as 10.0.0.2 and its destination address as 10.0.0.3. However, the packet may actually have to be transferred from substrate network address 192.168.0.3 to substrate network address 192.168.1.4 to reach its intended destination. An encapsulation protocol 244 (which is used to envelop or encapsulate packets associated with logical network sources/destinations within larger "augmented" packets associated with substrate network sources/destinations) and an associated mapping service 245 of the VCS may be used to accomplish this type of transfer in the depicted embodiment. Networking virtualization management components of the VCS (including the networking managers running at the PVMD 260, as well as networking managers running in the virtualization management hardware/software stacks of the VSs 225) may implement the encapsulation and de-capsulation operations of the protocol, and utilize the mapping service 245 to determine the specific substrate address to which the packets included in such transfers should be sent.

In the above example where a packet is being sent from CI 230A to CI 230G, the mapping service 245 may indicate to a networking manager associated with VS 225A that for IVN 233A, the destination private address 10.0.0.3 corresponds to the substrate address 192.168.1.4. The networking manager associated with VS 225A may generate an encapsulation packet which includes the original packet within it, has a substrate source address of 192.168.0.3, a substrate destination address of 192.168.1.4, and identifies the IVN 233A as the IVN within which the packet is being transferred. At the receiving end, a networking manager running at the PVMD 260 may extract (de-capsulate) the original packet from the encapsulation packet, and provide it to the destination CI 230G. In some embodiments, to ensure that the packet is from a trusted/valid source, the PVMD may consult the mapping service to perform a reverse mapping (e.g., to identify the origin of the packet) before extracting the original packet. The mapping service 245 may thus provide security by preventing the opening of packets that are not validated. For packets being transmitted in the reverse direction, the PVMD's networking manager(s) may consult the mapping service to obtain the right substrate address for the destination, and perform the required encapsulation operation.

Example Elements of Peripheral Virtualization Management Device

Figure 3:
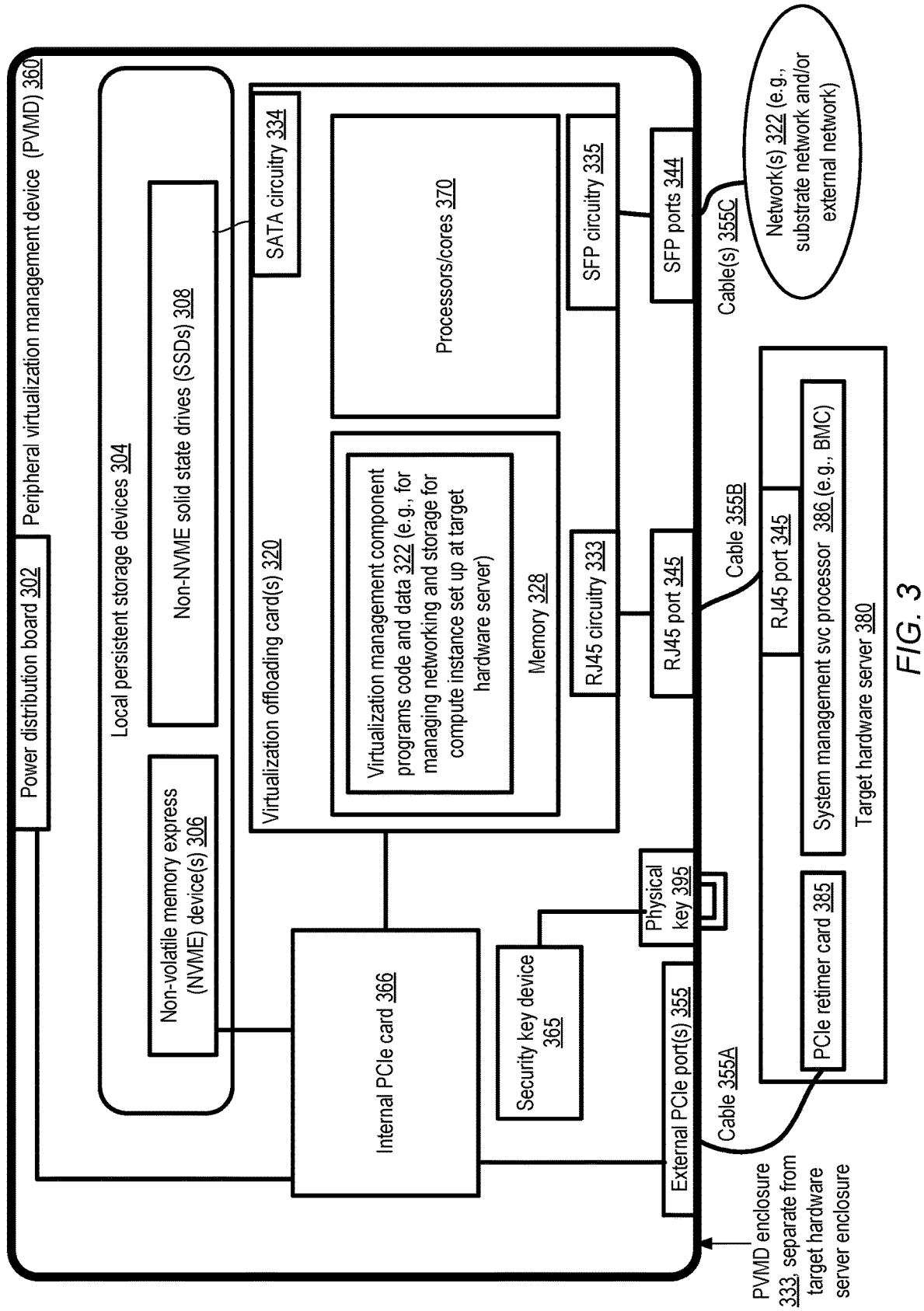
FIG. 3 illustrates example elements of a peripheral virtualization management device that may be used to enable compute instances to be set up at client-selected servers, according to at least some embodiments.

FIG. 3 illustrates example elements of a peripheral virtualization management device that may be used to enable compute instances to be set up at client-selected servers, according to at least some embodiments. As shown, peripheral virtualization management device (PVMD) 360, similar in functionality and features to PVMDs 160 shown in FIG. 1, may include one or more virtualization offloading cards 320, local persistent storage devices 304, and internal PCIe card 366, a security key device 365 linked to a physical key 395, a power distribution board 302, and several ports including one or more external PCIe ports 355, one or more small form-factor ports (SFPs) 344, and an RJ45 (Registered Jack 45) port 345 in the depicted embodiment. PVMD 360 may be packaged in a separate physical enclosure 333 or encasing than the target hardware server 380 at which one or more compute instances are to be set up using the PVMD in the depicted embodiment. Note that FIG. 3 is intended to provide a conceptual overview of the components of a PVMD; the relative positions and sizes of the components shown in FIG. 3 may not correspond to at least some implementations.

The virtualization offloading card(s) 320 may include one or more processors/cores 370 as well as one or more memories 328. The term "virtualization offloading" may be used to describe a card 320 because much of the work required to configure and manage compute instances running at a target hardware server 380 (e.g., a server selected by a client of the VCS) may be offloaded to a PVMD 360 in the depicted embodiment, enabling a larger fraction of the computing and other resources of the server to be utilized for the compute instances and client applications running at the compute instances. In the embodiment depicted in FIG. 3, code and data 322 of a number of virtualization management component programs (e.g., software and/or firmware) may be stored at the memories 328, and run using the processors/cores 370. In at least some embodiments, individual ones of the virtualization management components may be executed using respective subsets of the available cores/processors—e.g., one of the cores may be used for an embedded operating system, another for a network interface card emulator, and so on. At least a portion of the code resident in the memories 328 may be used to manage various aspects of networking and storage for compute instances launched at the target hardware server 380, and may therefore be referred to as a combination of a networking manager and a storage manager. Note that at least in some embodiments, at least a portion of the code and/or data 322 may be dynamically updated or modified, e.g., after one or more compute instances have been launched at the target hardware server using the code and data.

In at least some embodiments, the PVMD may be physically linked to the target hardware server in at least two ways, using cables 355A and 355B. Cable 355A may link a PCIe re-timer card 385 installed in the target hardware server 380 to an external PCIe port 355, which may in turn enable connectivity between the target hardware server and other components of the PVMD 360 via internal PCIe card 366, including local persistent storage devices 304 and the virtualization offloading cards 320. The re-timer card 385 may be used to improve PCIe signal integrity for enhancing system performance and reliability across potentially long cables 355A. In other embodiments, a repeater card may be used instead of or in addition to a re-timer card. In one embodiment, neither a repeater card nor a re-timer card may be required. Cable 355B may be used to connect RJ45 circuitry of the PVMD 360 via RJ45 port 345 to a system management service processor 386 (e.g., a baseboard management controller or BMC) of the target hardware server 380. The system management service processor 386, which in some implementations may be attached to a motherboard of the target hardware server, may be responsible for tasks such as monitoring the physical state of the target hardware server using sensors, providing results of such monitoring, rebooting/restarting the target hardware server when needed, and so on. Cables 355C may be used to link the PVMD 360 to one or more networks 322 (e.g., the VCS substrate network in scenarios in which the PVMD is located in a facility such as a provider network data center which provides direct access to the substrate network, and/or external networks set up at a client premise). Small form-factor circuitry 335, linked to one or more SFP ports 344, may be used to access the network(s) 322 in at least some embodiments.

One or more types of local persistent storage devices 304 may be incorporated within the PVMD 360 in some embodiments, such as NVME (non-volatile memory express) device(s) 306, other (non-NVME) solid state drives (SSDs) 308 accessible from SATA (Serial Advanced Technology Attachment) circuitry of the virtualization offloading card(s) 320, and so on. In at least some embodiments, storage manager code running at the virtualization offloading card(s) 320 may use the local persistent storage devices 304 to configure root volumes and/or other logical storage devices for compute instances instantiated at the target hardware server 380. In some embodiments, the storage manager code may implement block-level device interfaces locally (in effect implementing a subset of the functionality of a block storage service). In other embodiments, the storage manager may access a block storage service (and/or other network-accessible storage services) of the provider network to configure at least some storage devices.

In the embodiment depicted in FIG. 3, the PVMD 360 includes a physical key 355 (e.g., accessible from, and physically separable from) the front face of the PVMD enclosure. The physical key 395, which may be attached to a cryptographic security key device 365 located within the PVMD 360, may be used to provide physical security for data stored at the PVMD, including data stored within the local persistent storage devices 304. In at least some embodiments, removal or separation of the physical key 395 from the PVMD may render the contents of the persistent storage devices unreadable and/or un-writeable. The power distribution board 302 may be connected to a standard power source (e.g., a server rack power source) in the facility in which the PVMD and the target hardware server are located. It is noted that in some embodiments, alternatives to the specific components shown in FIG. 3 may be employed—e.g., USB may be used instead of or in addition to PCIe, multiplexed connectors/cables may be used between the target hardware server and the PVMD, and so on. The PVMD may include additional elements, not shown in FIG. 3, in some embodiments, such as a battery, additional security modules, and the like. In at least one embodiment, the enclosure 333 may occupy a 1-U slot within a standard server rack.

FIG. 4 illustrates example virtualization management software components which may be executed at a peripheral virtualization management device, according to at least some embodiments. The set of virtualization management software components 420 run at the PVMD's cores/processors may include an embedded operating system 425 (which may orchestrate the operations of the various hardware elements of the PVMD itself), one or more network interface card (NIC) emulators 429 as well as one or more emulators 429 for legacy devices in the depicted embodiment.

Block-device storage managers 437 run at the PVMD may, for example, configure root volumes for compute instances run on a client-selected hardware server using local persistent storage of the PVMD. NVME device emulators 439 may be used to manage accesses to NVME-based persistent storage in some embodiments. IVN data plane connectivity managers 441 may, for example, implement operations of the encapsulation protocol (such as encapsulating outbound packets, or de-capsulating inbound packets) used for traffic between compute instances of the target hardware server and other endpoints. Such other endpoints may include, for example, other compute instances within provider network data centers, other compute instances at different client-selected hardware servers, services other than the VCS, and so on. Calls to a VPC mapping service similar to the mapping service 245 of FIG. 2 may be initiated from the IVN data plane connectivity managers 441. In some embodiments, the IVN data plane connectivity managers may initiate or implement configuration operations to assign network addresses within an IVN to one or more virtual network interfaces that are programmatically attached to a compute instance running at the target hardware server, thus including the compute instance within the network address range designated for the IVN by a client.

Instance metadata service agents 449 may provide various elements of metadata in response to queries issued from a compute instance launched at the target hardware server in some embodiments. Such metadata may, for example, include credentials for authorizing/validating requests sent to other provider network services from the compute instance, block device mappings information of the compute instance, an identifier of the compute instance, and so on. In some embodiments, a link-local HTTP address accessible only from within the instance itself may be used to obtain the metadata at the compute instance.

In at least some embodiments, one or more agents 453 of the VCS control plane may run at the PVMD. Such agents may be responsible for receiving commands generated at the VCS control plane, for example, and initiating operations (e.g., configuration change operations) at the PVMD and/or the target hardware server in response to such commands.

In some embodiments in which the PVMD is installed at a facility which does not have direct access to the VCS substrate network, such as a client-owned premise, the PVMD may include a VCS extension manager (EM) 457. The EM may not necessarily be installed, instantiated or activated at a PVMD in scenarios in which the PVMD has direct access to the VCS substrate network in at least one embodiment. The extension manager 457 may establish secure communication channels (e.g., virtual private network or VPN tunnels) with extension traffic intermediaries set up at the provider network data centers, so that VCS commands and data can flow securely over non-substrate networks that are not managed and controlled by the VCS. Based on commands received via such channels, compute instances may be set up and configured at target hardware servers, in effect extending the VCS to premises external to the provider network as described below in further detail. In some embodiments, the extension managers may subsume control plane agents in environments in which direct substrate connectivity is not possible; that is, if an extension manager is run at a PVMD, a separate VCS control plane agent may not be required in such embodiments.

In at least one embodiment, one or more networks security agents 461 may be run at the PVMD. Such network security agents may be responsible for a number of operations, such as causing log records to be generated for various kinds of traffic (including DNS requests and responses, as well as standard IP packets) directed to or from a compute instance at the target hardware server attached to the PVMD, initiating or performing intrusion detection or exfiltration detection operations, and the like. It is noted that in some embodiments, a different combination of software and/or firmware components may be run at the PVMD than that shown by way of example in FIG. 4.

At some virtualized computing services, a virtualization management software stack including a hypervisor may be run on the virtualization server itself, and as a result a non-trivial fraction of the resources of the server may sometimes have to be used for virtualization management tasks rather than for client workloads. Furthermore, in such scenarios, the hardware servers at which compute instances are run may be selected by the VCS, as the virtualization management software stack may have to be tailored to the specific hardware used for the servers; as such, clients of the VCS may not have much flexibility regarding the specific hardware used for their compute instances.

Figure 5:
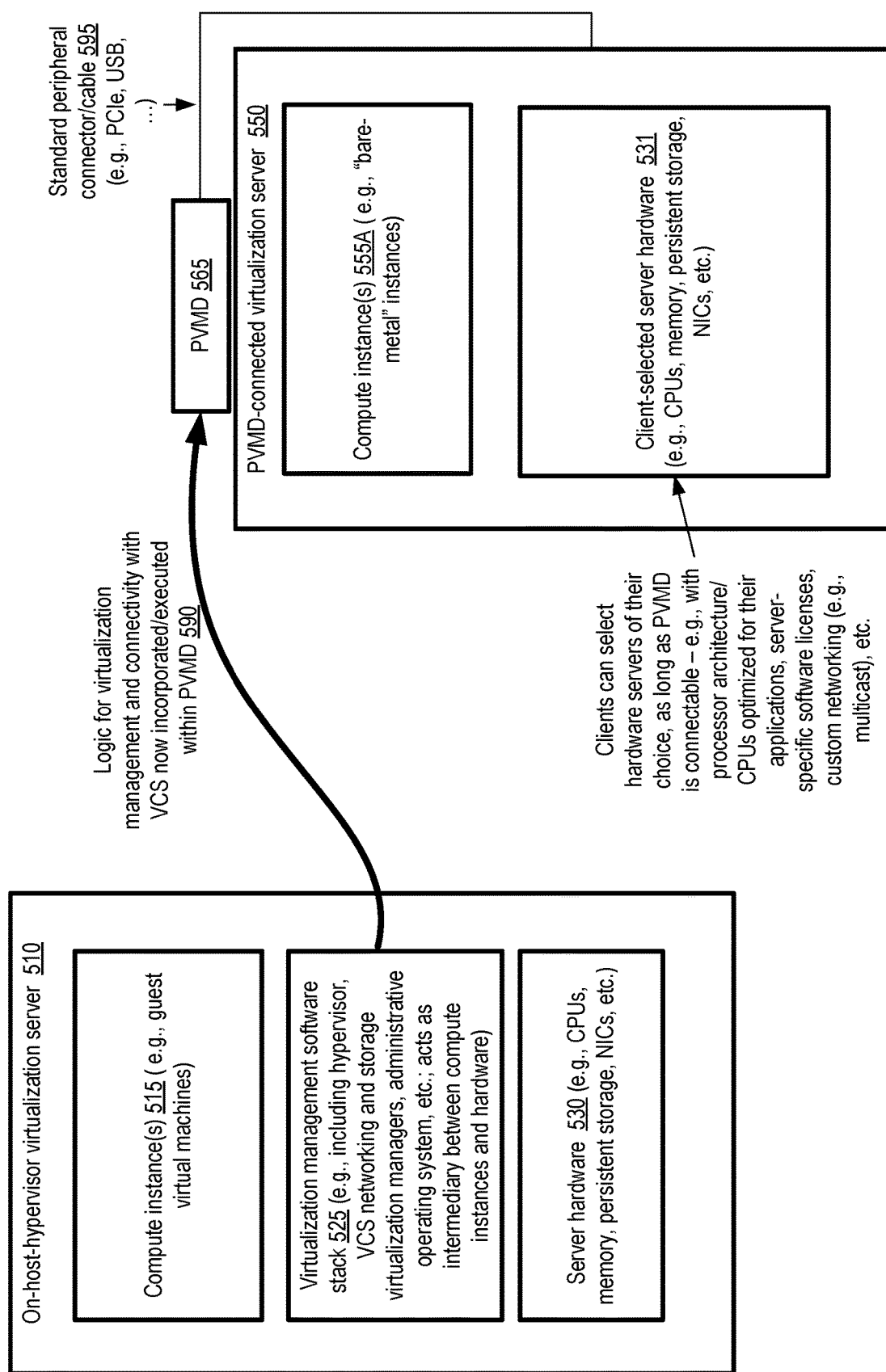
FIG. 5 illustrates example differences between a virtualization server which uses an on-host hypervisor and a client-selected hardware server at which compute instances may be configured using a peripheral virtualization management device, according to at least some embodiments.

FIG. 5 illustrates example differences between a virtualization server which uses an on-host hypervisor and a client-selected hardware server at which compute instances may be configured using a peripheral virtualization management device, according to at least some embodiments. An on-host-hypervisor virtualization server 510 may include server hardware 530, such as CPUs, memory, persistent storage devices, NICs and the like. A virtualization management software stack 525, which includes a hypervisor, VCS networking and storage virtualization managers, an administrative instance of an operating system, and the like, may act as an intermediary between the hardware 530 and one or more compute instances 515 such as guest virtual machines at the server 510.

In contrast, in a scenario in which a PVMD 565 is used as an intermediary to configure compute instances, all the logic for virtualization management and connectivity with the VCS (including the logic for inclusion of compute instances within isolated virtual networks, logic for setting up storage devices such as root volumes for the compute instances, etc.) may be executed within the PVMD itself, as indicated by arrow 590. A standard peripheral connector or cable (such as a PCIe or USB cable) may be used to physically link the PVMD to the virtualization server 550 whose hardware 531 is selected by the client. Clients may select any server hardware of their choice, as long as the PVMD is connectable to the server in such embodiments. Clients may, for example, select CPUs implementing a desired processor architecture, optimized for the client's applications, or clients may decide to use servers for which software licenses tied to the servers have to be used. In some cases, clients may wish to use servers that can be set up with custom networking configurations that may not be supported at the default VCS-selected servers, such as multi-cast configurations or the like. Note that although a PVMD 560 may act as an intermediary between the client-selected virtualization server and the VCS substrate network (as well as VCS logical networks built on top of the substrate network), this does not prevent the client-selected virtualization server 550 from also being configured within other networks selected or set up by the client in at least one embodiment. PVMDs 565 may thus provide substantially greater flexibility to VCS clients with respect to server choice than is possible using servers with conventional virtualization management software stacks run using the server's primary CPUs.

Example Uses of PVMDs at Provider Network Data Centers and Co-Location Facilities FIG. 6 illustrates example uses of a peripheral virtualization management device at provider network data centers and co-location facilities, according to at least some embodiments. At a given data center 602 of a provider network at which a VCS is implemented among a suite of network-accessible services, numerous server racks may be configured in the depicted embodiment. Some default server racks, such as 612A or 612B, may be used for virtualization servers that do not use PVMDs. Instead, for example, each individual ones of such racks may comprise a top-of-rack switch 610 (such as switch 610A or 610B) configured within or linked to the VCS substrate network 615. Individual default servers positioned within the default server racks may thus connect to the substrate network via their respective top-of-rack switches.

In response to one or more programmatic requests from a client of the VCS, in some embodiments a client-requested server rack 622A may be set up within a data center 602. Such a client-requested server rack 622A may house a client-selected hardware server 667A, connected to a PVMD 665A which is in turn physically linked directly (i.e., without requiring traversal of network links not controlled by the VCS operator) to the VCS substrate network 615. Using the virtualization management hardware and software incorporated within the PVMDs, one or more compute instances may be set up at the client-selected hardware server 667A. In some embodiments, compute instances may be set up at multiple client-selected servers using a single PVMD; in other embodiments, a one-to-one relationship may exist between client-selected servers and PVMDs. In one embodiment, multiple client-selected servers such as 667A and/or multiple PVMDs 665A may be housed within a single rack. In some embodiments, a separate client-requested rack 622A need not be set up to configure compute instances using PVMDs; instead, for example, a PVMD and a client-selected server may be housed within a server rack already in use for other virtualization servers at a provider network data center.

In some embodiments, a co-location facility 652 which has access to the VCS substrate network may house PVMDs and client-selected servers used for compute instances. A co-location facility 652 may include a collection of provider network operator-managed equipment 640, as well as client-managed or third-party managed equipment 642 in the depicted embodiment. The provider network operator managed equipment 640 may, for example, include one or more networking devices 660, such as routers, gateways, switches and the like which provide access to, and/or are configured within, the VCS substrate network. In response to one or more programmatic requests from a client, a client-selected server 667B may be set up at the co-location facility, and linked to a PVMD 665B which is able to access the substrate network via the networking devices 660. In some embodiments, a client-requested sever rack 622B may be used for the server 667B and the PVMD 665B, although such a special-purpose rack may not necessarily be required or used in other embodiments. Multiple client-selected servers, each linked to respective PVMDs (or sharing a PVMD) may be deployed at a co-location facility in some embodiments. In some embodiments, c client-selected server used for PVMD-enabled compute instances may also be connected to third-party or client-owned devices 677 housed at the co-location facility 652.

In some embodiments, PVMDs with direct access to the VCS substrate network, as well as associated client-selected servers, may be located within other types of premises than provider network data centers 602 or co-location facilities 652. For example, in one embodiment, a provider network operator may set up temporary facilities (e.g., in a shipping container located near a work site of a client), and PVMDs may be deployed to enable compute instances to be configured at client-selected hardware servers placed in such temporary facilities.

Example PVMD-Related Programmatic Interactions for DSC Mode Operation

Figure 7:
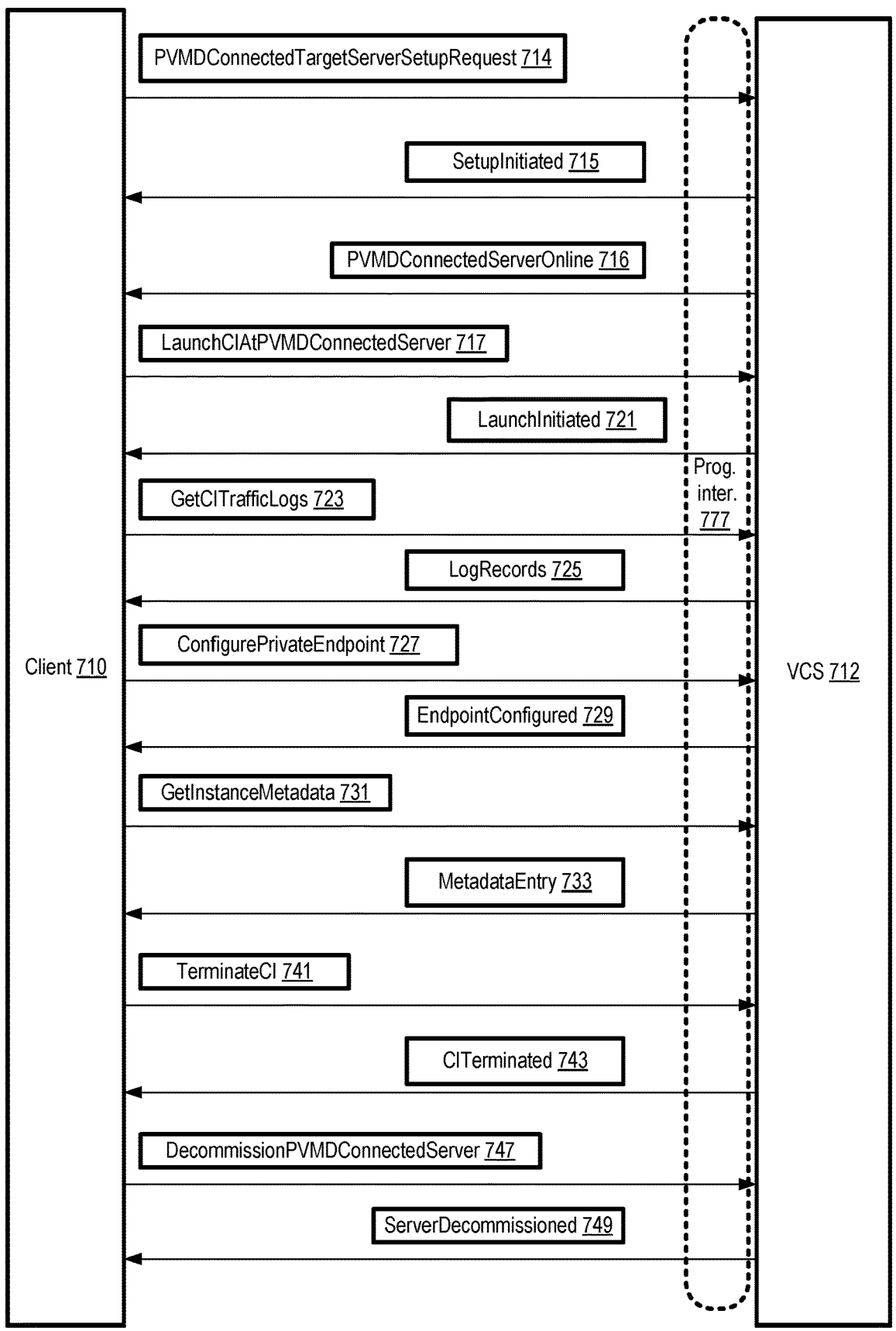
FIG. 7 illustrates example programmatic interactions pertaining to the configuration of compute instances using peripheral virtualization management devices, according to at least some embodiments.

FIG. 7 illustrates example programmatic interactions pertaining to the configuration of compute instances using peripheral virtualization management devices, according to at least some embodiments. While the programmatic interactions illustrated in FIG. 7 may be supported in an environment in which the PVMD can be connected directly to a VCS substrate network (i.e., when the PVMD is used in Direct Substrate Connectivity or DSC mode), at least some of the interactions shown may also be supported when the PVMD is used in environments in which connectivity to the substrate requires traversal of network pathways that are not necessarily managed/controlled by the operator of the VCS.

A VCS 712, similar in functionality and features to VCS 110 of FIG. 1, may implement programmatic interfaces 777 in the depicted embodiment. Such interfaces may include, for example, a set of application programming interfaces (APIs), command-line tools, graphical user interfaces, web-based consoles or the like. A VCS client 710 may submit a PVMDConnectedTargetServerSetupRequest 714 via the programmatic interfaces 777 to initiate the process of enabling compute instances via a PVMD at a client-selected hardware server. Request 714 may indicate various properties of a requested PVMD-connected configuration, such as details regarding the specifications of a client-selected server (the type of peripheral connectivity available at the server, the CPU type, memory, storage, physical footprint, power requirements and the like) which is to be used, the kinds of compute instances (e.g., bare-metal instances, micro virtual machines, or virtual machines belonging to other categories defined at the VCS) to be set up at the client-selected server, the IVN within which the compute instances are to be configured, the physical location preferences (e.g., provider network data center in a specified location, co-location facility, etc.), and so on in at least some embodiments.

In response, after recording the details of the request 714, the VCS 712 may send a SetupInitiated message 715 to the client in the depicted embodiment, indicating that tasks required to set up the desired configuration have been scheduled. In some cases, the actual physical setup of the PVMD and server combination may take some time (e.g., if a new rack has to be set up, if the hardware server has to be shipped to the desired facility, and so on). When the client-selected server has been physically connected to a PVMD, the PVMD has been connected to the VCS substrate network, and enough information about the client-selected server has been provided from the PMVD to the VCS control plane to present the client-selected server as a virtualization host, a PVMDConnectedServerOnline message 716 may be sent to the client in some embodiments. In at least one embodiment, the message 716 may include a host identifier which can be used by the client to refer to the client-selected server and/or the corresponding PVMD in subsequent programmatic requests directed to the client-selected server.

After the client-selected server has been designated as a virtualization host (e.g., as a dedicated host assigned in single-tenant mode to the client), the client may begin requesting configuration operations for one or more compute instances at the client-selected server. For example, the client may issue a LaunchCIAtPVMDConnectedServer request 717 to establish a compute instance of a specified category at the client-selected server. In response, such a compute instance may be launched, e.g., with the help of the PVMD's virtualization management components such as a networking manager and a storage manager, and a LaunchInitiated message 721 may be sent to the client 710. The LaunchInitiated response may, for example, include an identifier assigned by the VCS to the launched compute instance, and/or one or more IVN network addresses assigned to the compute instance.

The compute instance launched at the client-selected server may be treated, from the client's perspective, just like any other compute instance set up for the client in the depicted embodiment. For example, a client may request logs of network traffic to/from the compute instance, e.g., via a GetCITrafficLogs request 723. In some embodiments, records of various kinds of traffic may be logged, including for example Domain Name Service (DNS) requests and responses, traffic to the provider network's storage or database services, traffic to/from other compute instances within the same IVN, traffic to/from endpoints outside the compute instance's IVN, and so on. In at least some embodiments, the GetCITrafficLogs request 723 may include one or more filtering parameters specifying the particular types of traffic whose logs should be provided—e.g., whether only DNS request/response logs are desired, whether logs of traffic to a particular IVN or service are desired, the time range for which log records are to be provided, and so on. In some embodiments, one or more components running at the PVMD may be responsible for initiating the logging, and/or at least a subset of the logs may be stored at the PVMD. In other embodiments, the logs may be stored at other resources of the VCS, or at a storage service of the provider network. The requested log contents (if available) may be provided to the client via a LogRecords response 725 in some embodiments.

In at least some embodiments, a client may submit a GetInstanceMetadata request 731, e.g., via an HTTP request initiated from the compute instance launched at the client-selected server. An agent of an instance metadata service, running at the PVMD, may provide the requested metadata in a MetadataEntry response 733 in the depicted embodiment. In other embodiments, components of the instance metadata service that are not running on the PVMD may provide the requested metadata. Such metadata may include, for example, an identifier of the compute instance, credentials that can be used to submit requests to other provider network services from the compute instance, and so on. In at least one embodiment, such credentials may be automatically provided by/from the PVMD/s metadata service agent when a request is directed to another service from the compute instance, and a separate request to obtain the credentials may not be required.

If and when a client wishes to terminate a compute instance running at the PVMD-connected server, a TerminateCI request 741 may be sent to the VCS via programmatic interfaces 777. In response, the compute instance may be shut down, and a CITerminated message 743 may be sent to the client. If and when a client wishes to stop using the client-selected server for compute instances, a DecommissionPVMDConnectedServer request 747 may be submitted. In response, in some embodiments the PVMD may be disconnected from the client-selected server, and a Server-Decommissioned response 749 may be provided to the client 710. It is noted that other types of programmatic interactions (not shown in FIG. 7) associated with the use of PVMDs in environments in which direct substrate network connections from the PVMDs are possible may be supported in some embodiments. Examples of programmatic interactions for managing the use of PVMDs in premises external to the provider network of the VCS, e.g., where substrate networks cannot be accessed directly, are discussed below in further detail.

Methods for Configuring Compute Instance Using PVMDs in DSC Mode

Figure 8:
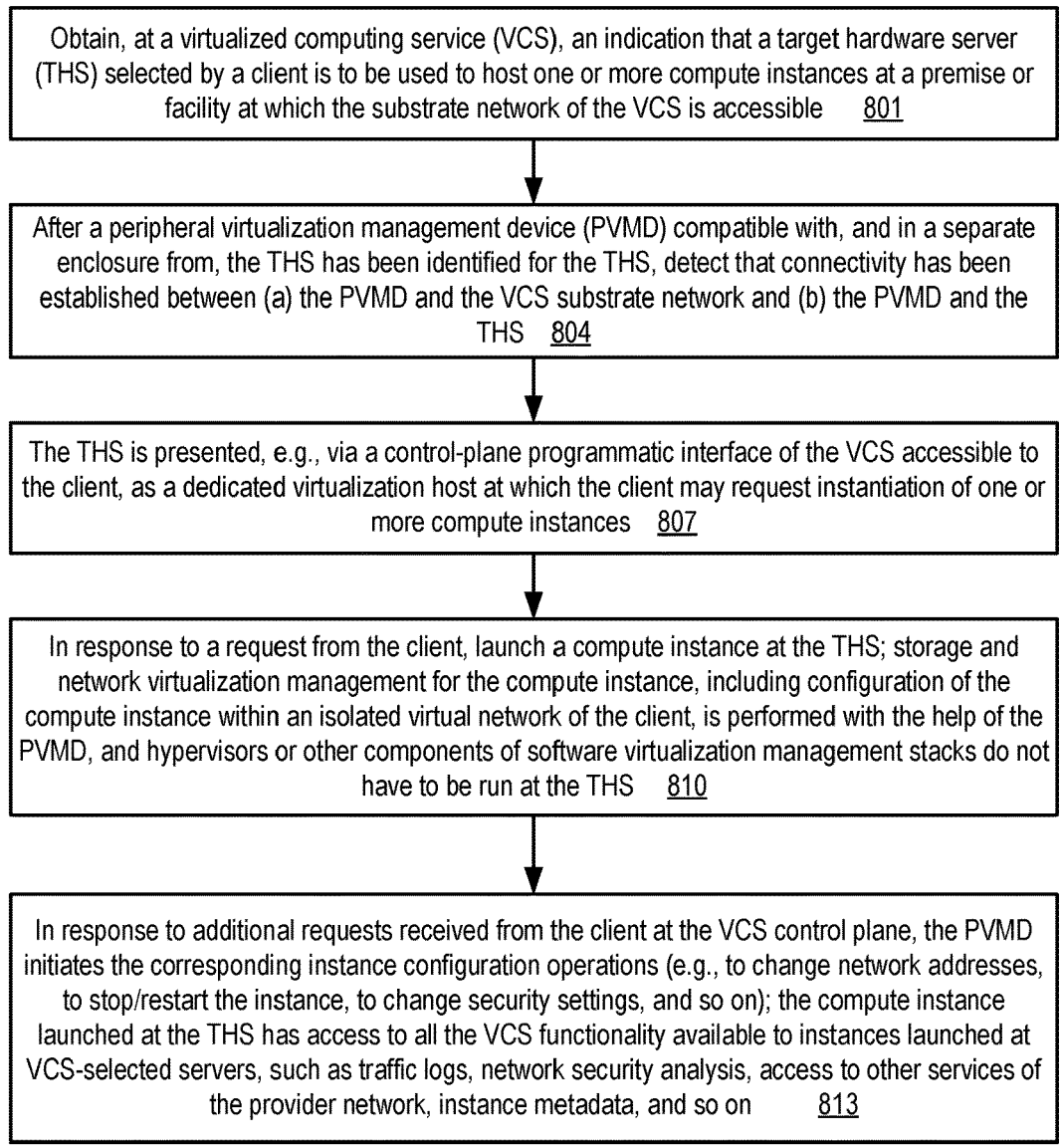
FIG. 8 is a flow diagram illustrating aspects of operations that may be performed at a provider network to configure compute instances using client-selected servers connected to peripheral virtualization management devices, according to at least some embodiments.

FIG. 8 is a flow diagram illustrating aspects of operations that may be performed at a provider network to configure compute instances using client-selected servers connected to peripheral virtualization management devices, according to at least some embodiments. As shown in element 801, an indication may be obtained at a VCS (e.g., via one or more programmatic interactions with a VCS client), that a target hardware server (THS) selected by the client is to be used to host one or more compute instances at a premise or facility at which the substrate network of the VCS is directly accessible. The substrate network may include physical networking equipment of the provider network, such as cables, switches, and like, linking at least some virtualization servers selected as default servers for compute instances by the VCS operator. Using the substrate as infrastructure, various logical networks may be configured at the VCS, including for example isolated virtual networks (IVNs) of the type discussed earlier. Traffic between entities assigned network addresses of the logical networks (such as various compute instances) may be transmitted over the links of the substrate network, e.g., using an encapsulation protocol and/or a VCS mapping service as discussed in the context of FIG. 2. In at least some embodiments, the client may suggest a specific location, such as a provider network data center or a co-location facility, at which the THS is to be located. In some embodiments, suggestions or recommendations for such locations may be provided to the client programmatically from the VCS, and the client may select or approve one such location.

A peripheral virtualization management device (PVMD) to be used to set up compute instances at the THS may be identified, and if needed, transported to the facility at which the THS is to be located in various embodiments. In some embodiments, the VCS operator may have several versions or categories of such PVMDs available, which may differ from one another in properties such as the specific type of peripheral connectors/protocols used, the total on-device computing power, the types of local persistent storage devices incorporated within the PVMDs, the capacity of local persistent storage devices, the physical footprints of the PVMDs, and so on. In such embodiments, a PVMD that is compatible with the THS may be identified and used— e.g., a PVMD that can be connected via a peripheral protocol supported at the THS may be selected, or a PVMD that is configured to enable compute instances of a specific type preferred by the client, may be found for use with the THS. The PVMD (and the VCS, based on communications from the PVMD) may detect that connectivity has been established between the PVMD and the substrate network, as well as between the PVMD and the THS (element 804) in the depicted embodiment. In some embodiments, the PVMD may transmit various details about the THS to the VCS control plane, e.g., via the substrate network. An encapsulation protocol implemented at a plurality of devices attached to the substrate network may be used to transmit traffic between one or more logical networks of the VCS in various embodiments, as discussed earlier. In at least one embodiment, multiple physical connections may be established between the PVMD and the THS—e.g., one connection may utilize a first cable linked to an external PCIe port of the PVMD, while another connection may utilize an RJ45 connector to enable commands and data to be transferred between the PVMD and a system management service processor of the THS.

The PVMD may cause the THS to be presented, e.g., via a control-plane programmatic interface of the VCS accessible to the client, as a dedicated virtualization host in some embodiments (element 807). Such a dedicated virtualization host may be indicated by the client as the resource to be used to launch one or more compute instances in single-tenant mode in some embodiments—that is, as suggested by the term "dedicated", such a virtualization host may be usable on behalf of only a single client. In other embodiments, the THS may be presented as a different type of virtualization host. In some embodiments, the THS may be assigned a network address of the substrate network, e.g., with the help of the PVMD and the VCS control plane, as part of the pre-requisite operations performed to cause the THS to be presented as a virtualization host.

In response to a programmatic request from the client, a compute instance may be launched at the THS in various embodiments after the THS has been designated as a virtualization host usable by the client (element 810). Storage and network virtualization tasks may be implemented at the PVMD for such a compute instance, including for example configuration of a root volume using persistent storage of the PVMD, inclusion of the compute instance within an IVN of the client, and so on. Hypervisors or other components of the software virtualization management stacks may not have to be run at the THS in the depicted embodiment, enabling the client to use all (or at least the vast majority) of the computational, memory and storage capacity of the THS for the client's applications.

After a compute instance is launched at the THS, it may be treated (from the perspective of the client) just like any other compute instance of the client, and may have access to all the VCS features available to compute instances launched without the help of PVMDs in at least some embodiments. In response to additional requests received from the client at the VCS control plane, the corresponding instance configuration operations may be initiated by the PVMD in some embodiments for the compute instance launched at the THS (element 813). Such operations may include, for example, changing network addresses, stopping/restarting the instance, changing security settings and the like. Logs of network traffic of the compute instance (including DNS requests and responses) may be generated and provided to clients on request in the depicted embodiment. Network security analysis, e.g., for intrusion detection, exfiltration detection, and the like may be performed in some embodiments with the help of the PVMD and/or components of the VCS. Access to other services (such as database services, storage services, load balancing services and the like) implemented at the provider network may be provided to programs running at the THS's compute instance. For example, a service request directed to another service of the provider network such as a database service, originating at a process running within a THS compute instance, may be transmitted/forwarded to the service by the PVMD. An agent of an instance metadata service may be run at the PVMD to provide instance metadata for the compute instance, e.g., including credentials needed to access some of the other services.

It is noted that in various embodiments, some of the operations shown in FIG. 8 may be implemented in a different order than that shown in the figure, or may be performed in parallel rather than sequentially. Additionally, some of the operations shown in FIG. 8 may not be required in one or more implementations.

Example System Environment with PVMDs Deployed at External Premises

Figure 9:
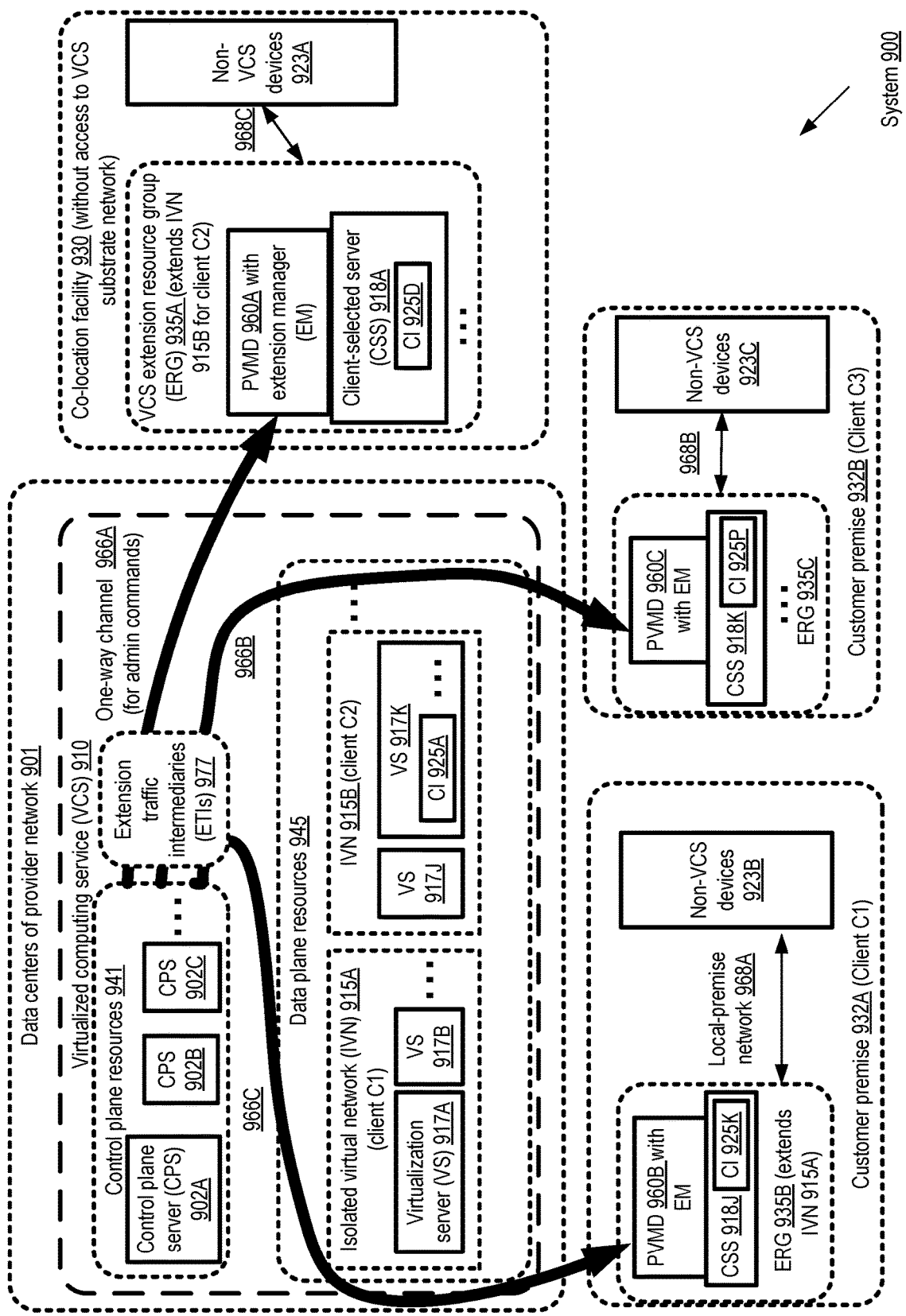
FIG. 9 illustrates an example system environment in which peripheral devices may be employed to enable extensions of a virtualized computing service of a provider network at premises external to the provider network, according to at least some embodiments.

As indicated earlier, PVMDs may be deployed in at least two modes of operation in various embodiments: direct substrate connectivity (DSC) mode, and external premises (EP) mode. In EP mode, the PVMDs may be used to configure and manage compute instances using client-selected hardware servers located at premises external to the provider network, from which the VCS substrate may not be accessible directly. FIG. 9 illustrates an example system environment in which peripheral devices may be employed to enable extensions of a virtualized computing service of a provider network at premises external to the provider network, according to at least some embodiments. As shown, system 900 includes resources located within data centers of a provider network 901, as well as resources located at premises external to the provider network which do not have access to the VCS substrate network, such as customer premises 932A and 932B and co-location facility 930.

Data plane resources 945 of the VCS 910 of system 900 may be organized into a set of isolated virtual networks (IVNs) similar to those discussed earlier. For example, IVN 915A may be set up on behalf of a client C1, IVN 915B may be established on behalf of client C2, and so on, with the clients being provided flexibility with respect to networking configuration settings within their respective IVNs. IVN 915A may include compute instances run at VCS-selected virtualization servers 917A and 917B, while IVN 915B may include compute instances launched at VCS-selected virtualization servers 917J and 917K (such as CI 925A). The VCS control plane resources 941 may include a set of servers 902, such as 902A, 902B and 902C in the depicted embodiment, responsible for administrative tasks such as receiving and responding to instance configuration requests from clients, provisioning additional VCS-selected virtualization servers, monitoring the health of data plane resources, and so on.

In the embodiment depicted in FIG. 9, respective PVMDs 960 (such as 960A, 960B or 960C) running extension managers (EMs) may be used to enable compute instances to be launched and configured at client-selected servers at the external premises 932A, 932B and 930. For example, PVMD 960A may be used to enable client-selected server (CSS) 918A at co-location facility 930 to host compute instances, PVMD 960B may be used to enable compute instances to be established at CSS 918J at customer premise 932A of VCS client C1, and PVMD 960C may be connected to CSS 918K at customer premise 932B of client C3. Note that the PVMDs 960 may also comprise networking and storage virtualization managers, in addition to the EMs, in the depicted embodiment. In addition to the client-selected servers 918, at least some of the external premises 932A, 932B and 930 may also include non-VCS devices (i.e., servers that are not intended to host VCS compute instances)—for example, premise 932A may include non- VCS devices 923B, premise 932B may include non-VCS devices 923C, and co-location facility 930 may include non-VCS devices 923A in the depicted embodiment. At least some of the non-VCS devices may also be linked to the CSSs via local-premise networks 968 (e.g., 968A, 968B or 968C)—as such, the CSSs may be configured within multiple networks, including the local networks 968 and one or more VCS networks (e.g., using addresses from a range used for the VCS substrate network). Note that the CSSs 918 may differ from one another—e.g., CSS 918J may have different or more CPUs than CSS 918K, CSS 918A may have greater memory or a different CPU architecture than CSS 918K, and so on. Note also that while only a single CSS is shown at each of the external premises in FIG. 9, multiple such CSSs may be located and used to host VCS compute instances within a single external premise in at least some embodiments.

The set of client-selected servers and PVMDs at a given external premise, along with the compute instances run using the PVMDs, associated metadata and configuration information, may collectively be referred to as an extension resource group (ERG) 935 of the VCS in various embodiments. For example, ERG 935B (comprising PVMD 960B, CI 925K and CSS 918J) may be configured at customer premise 932A, ERG 935C (comprising PVMD 960C, CI 925P and CSS 918K) may be configured at customer premise 932B, and ERG 932C (comprising PVMD 960A, CI 925D and CSS 918A) may be configured within co-location facility 930 in the depicted embodiment. In effect, from the perspective of a customer of the VCS, in various embodiments an ERG may represent a local extension of the capabilities of the VCS, that can be set up at any desired physical location that has access to the Internet and can accommodate (e.g., with respect to physical space, electrical power, etc.) a set of PVMDs and client-selected hardware devices. From the perspective of the VCS itself, an ERG may be considered to be virtually located in the same provider network data centers as the core VCS infrastructure, while being physically located in a customer-selected premise. In various embodiments, when an ERG is set up at a customer-selected location, the resources of the ERG may be managed by control plane components of the VCS that are located in the data centers of the provider network. As such, in at least some embodiments, setting up and using an ERG at a given premise may not require control plane capabilities of the VCS to be duplicated locally; instead, secure network connections may be set up for control-plane commands to be transmitted from the data centers of the provider network to PVMDs at the ERG, and the resources of the ERG may be devoted primarily to data plane operations.

In some embodiments, one or more of the CIs of an ERG may be configured within an IVN 915 (e.g., the CIs may be programmatically attached to virtual network interfaces with addresses within the range of addresses of the IVN, the CIs may be included in a database of compute instances of the IVN, information about the membership of the CIs in the IVN may be provided to a mapping service of the VCS, etc.). In some cases, a CI running at an ERG with the help of a PVMD may be included in an IVN which also includes CIs within the provider network data center, and such an ERG may be said to extend the IVN. For example, ERG 935B extends IVN 915A of client C1 in FIG. 9, while ERG 935A extends IVN 915B configured for client C2. Some ERGs may include CIs configured within an IVN that does not include any compute instances within the VCS data centers, or may not even be configured within IVNs.

Because the external premises 930 and 932 do not have direct access to the VCS substrate, additional work may be required to configure compute instances using PVMDs than was required when the PVMDs were used in DSC mode. In the embodiment depicted in FIG. 9, an extension manager of a PVMD may perform several functions. For example, the extension manager may establish connectivity with one or more extension traffic intermediaries (ETIs) 977 of the VCS via one or more secure channels (such as Virtual Private Network (VPN) tunnels) 966. The secure channels 977 may be required because the traffic between the PVMD and the VCS control plane (as well as data plane) has to flow over physical network paths that are not controlled or managed by the VCS, and such physical network paths may thus not be trusted from the perspective of the VCS. The ETIs 977 may be implemented (e.g., using one or more compute instances and/or IVNs set up on behalf of the VCS control plane) at computing devices within the data centers of the provider network 901, and the ETIs may be configured to perform one or more security operations with respect to traffic between the external premise and the data centers of the provider network. Control-plane commands may only be permitted to flow in one direction using the secure channels established with the ETIs in the depicted embodiment: from the data centers of the provider network to the external premise. In contrast, data plane traffic may flow in either direction between the external premise and the provider network in various embodiments. Additional details regarding the manner in which control plane and data plane traffic flows between the provider network data centers and the external premises in various embodiments are provided below.

The extension manager of a PVMD 960 may also assign a network address of the VCS substrate network (i.e., a network address selected from a range of addresses assigned to virtualization servers within the VCS substrate network) to the CSS 918 to which the PVMD is attached in at least some embodiments. For example, in one embodiment the substrate network address may be assigned subsequent to a determination that a peripheral card of the CSS 918 has been linked to the PVMD (e.g., to an external peripheral port of the PVMD). The substrate address assigned to the CSS 918 may also be assigned to one of the ETIs 977 in at least some embodiments, enabling the ETI to serve as a proxy or representative of the CSS 918 within the provider network data centers.

In addition, the extension manager may act as an intermediary for configuration commands pertaining to the CIs launched at a CSS 918 within an ERG 935 in at least some embodiments. For example, a client of the VCS may submit a request for a configuration operation of a CI at an ERG to the VCS control plane (using pathways other than the secure channels set up with the ETIs), and an indication of the request may be provided to the extension manager at that ERG from the ETIs. In response to the indication, one or more configuration operations of the compute instance may be performed at the CSS.

In various embodiments, the extension manager may also act as a bridge between the VCS and the local-premise networks at the external premises. For example, in order to enable traffic to flow between non-VCS devices 923 and the VCS compute instances, the extension managers may perform encapsulation/de-capsulation of packets in accordance with an encapsulation protocol, and/or network address translation operations.

The CIs set up at the CSSs 918 of an ERG 935 may implement the same functions, and be granted the same capabilities and rights, as CIs set up within the data centers of the provider network 901 in various embodiments. As mentioned earlier, the ERG CIs may be configured within IVNs, e.g., with IVN addresses being assigned to virtual network interfaces that are programmatically attached to the CIs, and with IVN security rules being enforced for the CIs. The PVMDs may include instance metadata service agents that provide credentials to the CIs, usable to access other provider network services as described earlier, as well as other types of instance metadata such as CI identifiers, networking configuration details, and so on. In some embodiments, PVMDs located at several different external premises may be used to configure compute instances within the same IVN—that is, an IVN may include compute instances set up at respective client-selected hardware servers at multiple locations outside the provider network. In some embodiments, e.g., to simplify network administration, the set of CIs at each of the different external premises may be configured within a respective subnet of the IVN. Network traffic logs of the CIs running at the ERGs may be captured, e.g. at or with the help of the PVMDs, and provided to VCS clients in various embodiments. In at least one embodiment, traffic from an ERG CI to a DNS server external to the provider network (such as a DNS server set up for a client network) may be captured and logged, and provided to VCS clients upon request. Private endpoints may be set up to enable the ERG CIs to access publicly-accessible services of the provider network without using paths or links of the public Internet if desired by the VCS client on whose behalf the CIs are configured, and client-specified policies controlling the flow of traffic via such endpoints may be enforced to determine whether a given packet from the CI should be forwarded to a service or not. The PVMDs 960 used at the external premises may include some or all of the components shown in FIG. 3 in various embodiments, and may be connected to the CSSs 918 and the local-premise networks using any appropriate connector or cable.

In at least some embodiments, an extension manager (EM) may be instantiated in response to the detection of one or more triggering conditions (such as the detection of power and/or Internet connectivity) at the PVMD. The EM may then initiate the automated establishment of (or at least participate in the automated establishment of) secure network connectivity with one or more VCS components (e.g., the ETIs 977) at one or more provider network data centers automatically, e.g., without requiring additional configuration guidance from a VCS client on whose behalf the PVMD is configured. After connectivity has been established, in various embodiments the client may issue commands to instantiate compute instances (and/or perform other operations using compute instances) at the client-selected server connected to the PVMD, in a manner analogous to the way in which such commands would be issued with respect to compute instances that use only provider network resources. From the perspective of the VCS client, the functionality of the VCS may now seamlessly be utilized using local resources (as well as resources located in the provider network data centers, if desired). The compute instances set up at the ERG may communicate (e.g., with the help of the PVMD, which may perform address translation and/or other encapsulation protocol-related processing) with non-VCS devices 923 in various embodiments, as well as with other CIs that are set up in the provider network data centers or at external premises, as desired. At least some CIs that are set up at the ERG, and associated higher-level services that use such CIs as building blocks, may continue to function even during periods of time when connectivity to the provider network data centers is temporarily disrupted in some embodiments. Especially for VCS customers that wish to access and process large amounts of application data that is stored at customer data centers (e.g., for legal compliance, security or other reasons) with low latencies, the ability to set up VCS CIs co-located with the application data may be highly beneficial in various embodiments.

Example Extension Traffic Intermediary Devices

Figure 10:
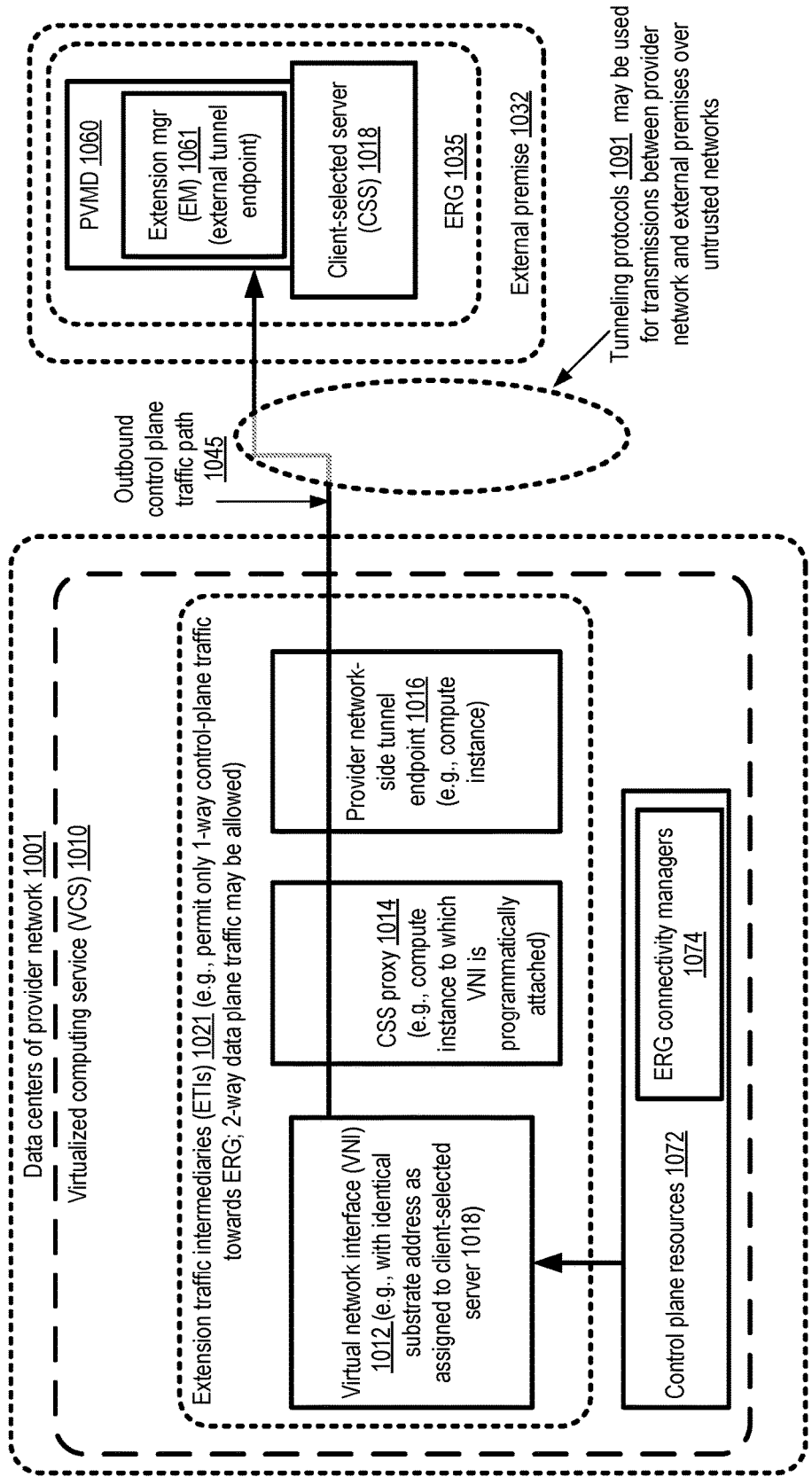
FIG. 10 illustrates example extension traffic intermediary devices that may be configured to enable control plane traffic to flow securely from data centers of a provider network to external premises at which peripheral virtualization management devices are deployed, according to at least some embodiments.

FIG. 10 illustrates example extension traffic intermediary devices that may be configured to enable control plane traffic to flow securely from data centers of a provider network to external premises at which peripheral virtualization management devices are deployed, according to at least some embodiments. In the depicted embodiment, extension resource group (ERG) 1035 comprising a client-selected server 1018 may be located at an external premise 1032. A PVMD 1060, similar in features and functionality to the PVMDs 960 of FIG. 9, may be attached to the server 1018, e.g., via one or more cables or connectors. The PVMD 1060 may include an extension manager (EM) 1061.

At the data centers 1001 of a provider network at which the VCS 1010 is implemented, control plane resources 1072 may include one or more ERG connectivity managers 1074 (implemented using some combination of hardware and software at one or more computing devices of the VCS) in the depicted embodiment. The ERG connectivity manager may determine that connectivity via secure channels is to be established with EM 1061, e.g., in response to a programmatic request received at the control plane resources 1072. In some embodiments, the EM 1061 may send a request for secure connectivity to the VCS control plane (e.g., via pathways of the public Internet) when the EM is brought online and connected to the Internet via a local-premise network at the external premise 1032. In order to enable the secure connectivity, a set of extension traffic intermediaries (ETIs) 1021, may be set up by an ERG connectivity manager.

ETIs 1021 may include, for example, a CSS proxy 1014 and a tunnel endpoint 1016 (referred to as a provider-network-side tunnel endpoint) in the depicted embodiment. In some embodiments, the CSS proxy 1014 and the tunnel endpoint 1016 may comprise respective compute instances of the VCS. In at least one embodiment, the CSS proxy may be set up within one ENI established on behalf of the VCS control plane (distinct from the ENIs set up on behalf of VCS clients), while the tunnel endpoint 1016 may be set up within another ENI established for the VCS control plane.

A virtual network interface (VNI) 1012 may be programmatically attached to the CSS proxy 1014 by the connectivity manager 1074. In various embodiments, VNIs (which may also be referred to as "elastic network interfaces") may be configured at a VCS and/or at VCS extension resource groups, enabling some networking-related attributes such as IP (Internet Protocol) addresses to be transferred relatively easily between compute instances without necessarily reconfiguring physical network cards. Such attribute transfers may be accomplished, for example, by detaching a VNI programmatically from one compute instance and attaching it programmatically to another compute instance. One or more VNIs such as VNI 1012 may be attached to (or detached from) a given compute instance via programmatic operations, independently for example of the specific hardware network interface cards (NICs) of the host at which the compute instance runs in the depicted embodiment. A given VNI may have a number of attributes, including an IVN identifier indicating the IVN within which the VNI is configured, one or more private IP addresses (addresses not visible or advertised outside the IVN, at least by default), and zero or more public IP addresses, one or more subnet identifiers (e.g., expressed in Classless Inter-Domain Routing or CIDR format), one or more security rules (similar to firewall rules), and so on. In at least some embodiments, the VNI 1012 may be assigned the identical substrate network address which is assigned to the CSS 1018 for which the proxy 1014 is configured. In at least some embodiments, the EM 1061 may receive an indication of the substrate network address from the ERG connectivity manager, and assign that address to the CSS 1018. The EM 1061 may serve as the external endpoint of a secure (e.g., encrypted) network tunnel established with the provider network-side tunnel endpoint 1016. Any of a variety of tunneling protocols 1091 (e.g., standard VPN protocols, customized protocols utilized within the VCS, etc.) may be use for transmissions of packets between the provider network and the external premises over potentially untrusted networks in various embodiments.

Because identical substrate network addresses are assigned to the CSS proxy 1014 (via its attached VNI 1012) and to the CSS 1018, the VCS control plane may use the CSS proxy 1014 as the destination for control plane commands (e.g., configuration commands generated in response to client-issued requests) that are actually intended for the CSS 1018 in the depicted embodiment. As such, from the perspective of the VCS control plane, the CSS may appear to be just another virtualization server that can be accessed via the substrate network of the VCS. When a control plane command is generated, it may be received at the CSS proxy, and a version of the command may be sent on via the outbound control plane traffic path 1045. In some embodiments, the CSS proxy 1014 and/or the provider network-side tunnel endpoint 1016 may apply one or more security-related transformation operations on the command before sending it on to the ERG 1035. For example, the version of the command obtained at the proxy from the VCS control plane may comprise one or more security tokens (e.g., tokens that can be used to verify the identity of the requester of the operation performed as a result of the command, and that the requester has the permissions required to request the operation) in some embodiments, and the CSS proxy may strip or exclude the tokens from the version of the command forwarded on to the ERG. In at least some embodiments, the original security tokens may be transformed, and a transformed version of the security tokens may be included in the forwarded version of the command. In at least one embodiments, respective message authentication codes (including for example hash-based message authentication codes or HMACs) may be generated for the outbound control plane commands sent from the proxy to the ERG. In various embodiments, the CSS proxy may log all outbound communication messages sent to a given ERG, and the logged messages may be examined by the client in whose behalf the ERG is set up if desired. In some embodiments, at least two virtual network interfaces may be associated with a given CSS proxy—one that is used to obtain commands from the VCS control plane, and one that is used to communicate with the tunnel endpoint 1016.

In some embodiments, data plane traffic may also flow between the VCS and the external premise via secure channels or tunnels, e.g., separate from the channels used for control plane traffic. Data plane traffic may flow in either direction over such tunnels (not shown explicitly in FIG. 10), and may not involve the use of a CSS proxy. In one embodiment, a VNI with the same substrate address as assigned to the CSS 1018 may also be set up within the VCS for data plane traffic to/from the CSS.

Example Intra-Premise PVMD Communication Channels

Figure 11:
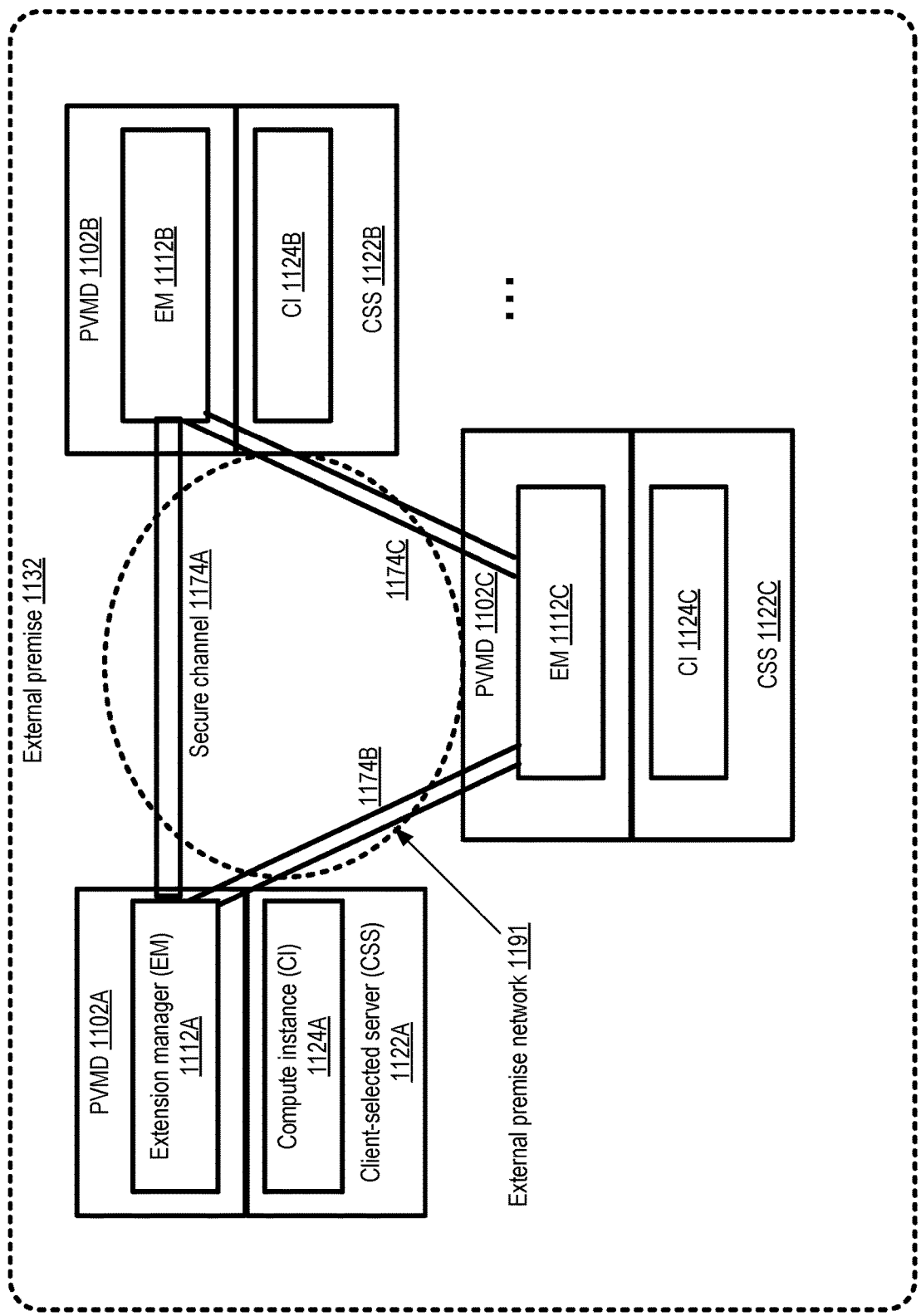
FIG. 11 illustrates example communication channels set up between extension managers running at various peripheral virtualization management devices, according to at least some embodiments.

FIG. 11 illustrates example communication channels set up between extension managers running at various peripheral virtualization management devices, according to at least some embodiments. In the depicted embodiment, a plurality of compute instances 1124 may be established using client-selected hardware servers within a given external premise 1132. For example, compute instance (CI) 1124A may be set up at client-selected server 1122A with the help of PVMD 1102A, CI 1124B may be set up at client-selected server 1122B with the help of PVMD 1102B, and CI 1124C may be set up at client-selected server 1122C with the help of PVMD 1102C.

Each of the client-selected servers (CSSs) 1122 may be connected to an external premise network 1191, e.g., a network configured within the external premise by or on behalf of the VCS client at whose requests the CIs 1124 are launched. In addition to providing secure connectivity between the VCS and the CIs at the external premise 1132, PVMDs 1102 may also be responsible for configuring secure channels 1174 (e.g., 1174A, 1174B or 1174C) between the CIs 1124 in the depicted embodiment. The secure channels may be set up the extension managers (EMs) 1112, such as 1112A, 1112B and 1112C, and used to transfer packets among the CIs in accordance with the VCS's encapsulation protocol in at least some embodiments. The CIs 1124 may be assigned network addresses within their respective IVN's private address ranges, for example (e.g., as a result of programmatically attaching respective virtual network interfaces to the CIs 1124 by the PVMDs 1102), while the CSSs may be assigned respective substrate network addresses.

In some embodiments, as shown in FIG. 11, each of the PVMDs used at a given external premise may include a respective extension manager (EM) 1112. In other embodiments, only a single "master" EM may be required at a given external premise, e.g., for the entire extension resource group potentially comprising multiple CSSs and multiple CIs. Such a master EM may set up secure channels with the extension traffic intermediaries for all the traffic between the data centers of the VCS and the extension resource group. Within the ERG itself, such a master EM, running at a particular PVMD attached to a particular CSS, may communicate over secure communication channels with the PVMDs set up for other CSSs. In some embodiments, all the CIs 1124 set up at an ERG may be configured within a single IVN. In other embodiments, some CIs of the ERG may be configured within different IVNs than others.

In at least some embodiments, not all the CIs of an ERG may necessarily be set up using customer-selected hardware servers; instead, some hardware servers may be pre-configured by the VCS operator and shipped to the external premise. PVMDs 1102 comprising EMs 1112 may be attached to such VCS-selected or VCS-configured servers as well, and used to manage compute instances launched at the VCS-configured servers, just as PVMDs may be used to manage compute instances at client-selected servers. In some embodiments, PVMDs may even be used to configure and manage compute instances at VCS-selected hardware servers within provider network data centers.

Example PVMD-Enabled Geographically-Distributed Logical Network

Figure 12:
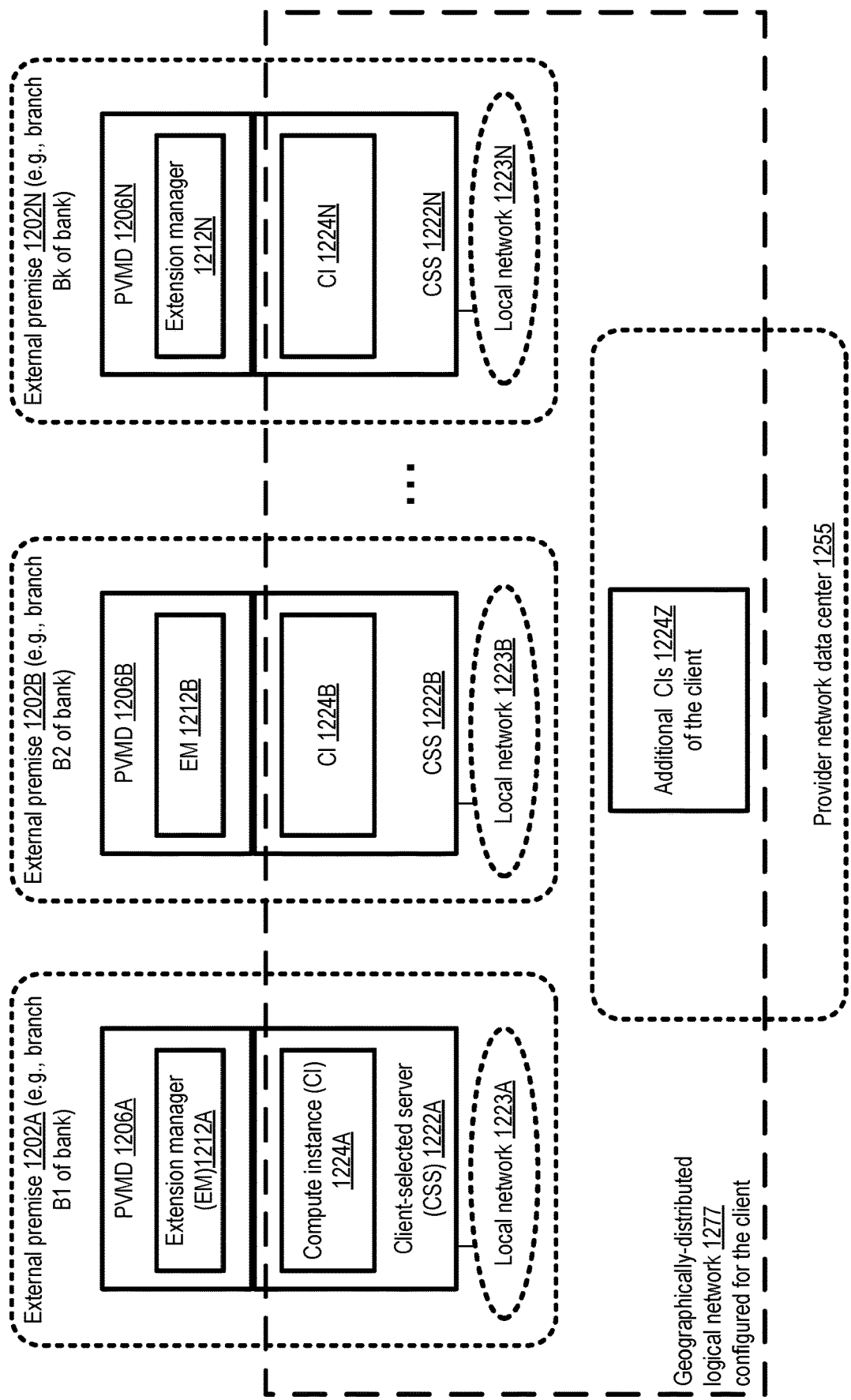
FIG. 12 illustrates example geographically-distributed logical networks that may be configured using a plurality of peripheral virtualization management devices located at respective premises outside a provider network, according to at least some embodiments.

In some embodiments, a given client or customer of a VCS may wish to use client-selected servers for compute instances at several different locations, and to include several such instances within the same logical network such as an IVN. FIG. 12 illustrates example geographically-distributed logical networks that may be configured using a plurality of peripheral virtualization management devices located at respective premises outside a provider network, according to at least some embodiments. In the depicted embodiment, a client of the VCS may have resources distributed across multiple premises outside the provider network data centers, such as external premise 1202A, 1202B or 1202N. In one example scenario, these external premises may each represent a respective branch (e.g., B1, B2, . . . , Bk) of a bank.

The client may wish to run some applications using compute instances launched at respective client-selected servers (CSSs) 1222 at each of the external premises 1202—e.g., using CSS 1222A at premise 1202A, CSS 1222B at premise 1202B, and CSS 1222N at premise 1202N. The client may further wish to include all the compute instances launched at the different premises (e.g., CI 1224A, 1224B, and 1224N), as well as a set of additional CIs 1224Z launched at the data centers 1255 of the provider network, within a single logical network 1277. Such a geographically-distributed logical network may be configured using the IVN connectivity managers and/or EMs of respective PVMDs set up at each of the premises in the depicted embodiment. For example, respective EMs 121A, 1212B and 1212C may be executed within PVMDs 1206A, 1206B and 1206D, and such EMs may establish connectivity to the kinds of extension intermediaries described earlier for respective extension resource groups (ERGs) at the premises 1202. The extension group instances 1224A, 1224B and 1224C may be assigned network addresses within the logical network or IVN 1277, e.g., using the same range of addresses that are assigned to the additional CIs 1224Z. Components of the PVMDs may perform the needed encapsulation/de-capsulation operations of the encapsulation protocol used at the VCS to enable packets to flow between the different CIs 1224 (and also between the CIs 1224 and other endpoints). In some embodiments, a separate subnet (identified by a respective CIDR address range) may be used for the CIs at each external premise, e.g., to simplify network administration, configure location-specific security, and/or for other reasons.

Respective VCS substrate network addresses (also assigned to extension traffic intermediaries at the provider network data centers as discussed earlier) may be assigned to the CSSs 1222 in the depicted embodiment. Each CSS may also have an address assigned to it within the external-premise local networks 1223 (e.g., networks 1223A, 1223B or 1223N, set up by the client's IT staff at the different premises). In at least one embodiment, it may be the case that the range of network addresses assigned to devices (including the CSSs) within the different external-premise local networks 1223 at the different premises 1202 may overlap—for example, the IPv4 address 10.0.0.1 may be assigned to CSS 1222A within local network 1223A, and also to CSS 1222B within local network 1223B. In some scenarios, in order to be able to handle the flow of traffic between CIs at CSSs which were originally assigned the same address within their local networks, the overlapping addresses assigned to at least some of the CSSs may have to be changed. An alternative approach to the problem of overlapping IP addresses may be employed in some embodiments, in which bi-directional network address translation (NAT) may be implemented with the help of the PVMDs 1206.

Example Use of Provider Network Services Via PVMDs

Figure 13:
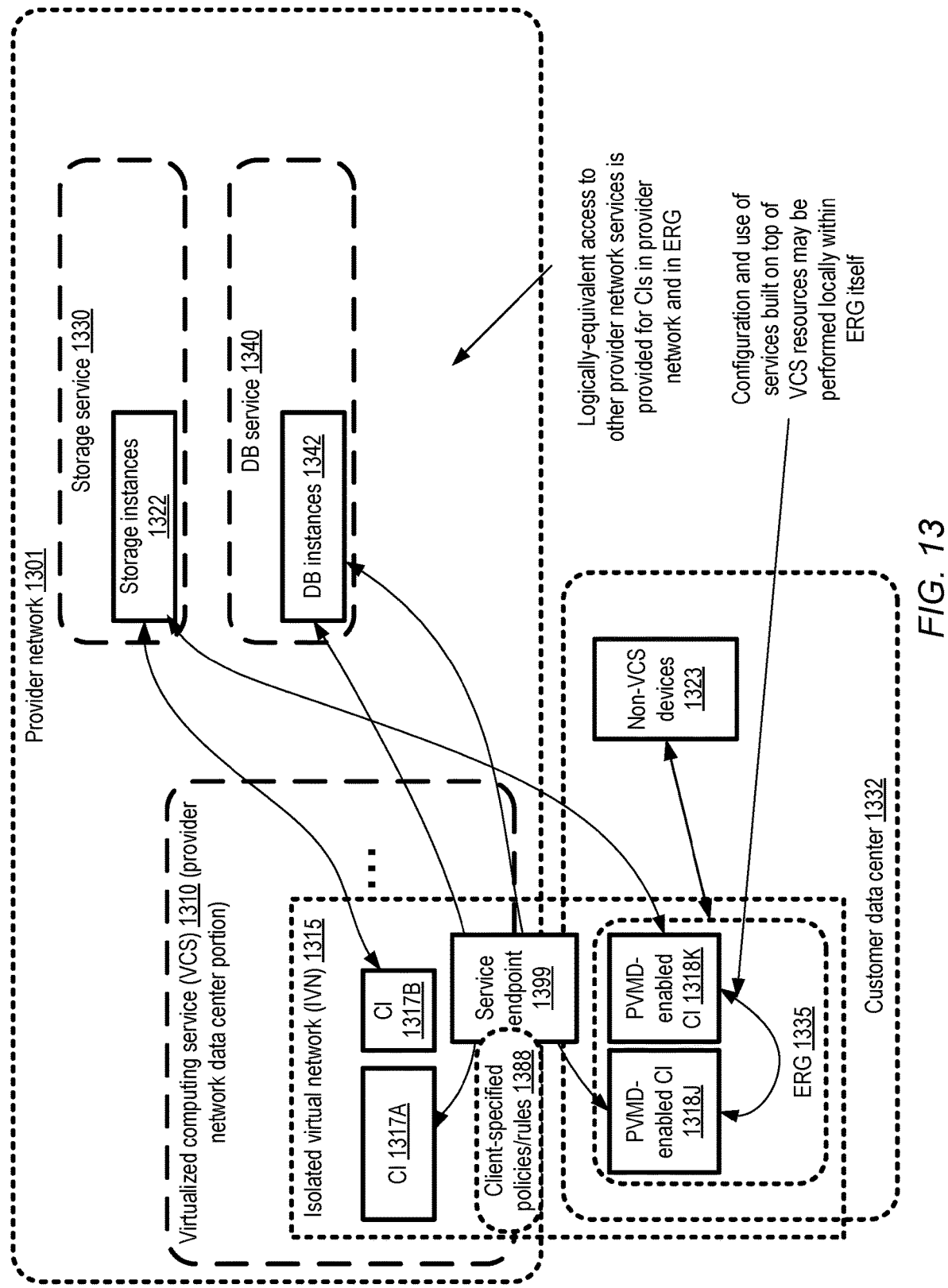
FIG. 13 illustrates an example of the use of additional provider network services at an extension resource group of a virtualized computing service, according to at least some embodiments.

In some embodiments, a provider network at which a virtualized computing service is implemented may also provide access to other higher-level network-accessible services that utilize VCS compute instances as building blocks—for example, an instance of a database may be implemented using a compute instance of the VCS, and offered for use by clients of a network-accessible database service. In various embodiments, such higher-level services may also be made available at extension resource groups (ERGs), e.g., using the local compute instances set up within the ERGs to implement the features of the services. In addition, other services of the provider network, which do not rely on VCS compute instances directly, may also be accessed from the compute instances set up at ERGs in some embodiments, in a manner analogous to the way that such services are accessible from compute instances set up within provider network data centers. FIG. 13 illustrates an example of the use of additional provider network services at an extension resource group of a virtualized computing service, according to at least some embodiments.

In the depicted embodiment, provider network 1301 comprises at least a virtualized computing service (VCS) (similar in functionality and features to VCS 110 of FIG. 1), a storage service 1330, and a database service 1342. A portion 1310 of the VCS may be implemented using resources located at provider network data centers, and extensions of the VCS may be set up at locations external to the provider network, such as an ERG 1335 located within a customer data center 1332 which also includes one or more non-VCS devices 1323 (e.g., servers at which VCS compute instances are not to be set up).

In the example scenario depicted in FIG. 13, an isolated virtual network (IVN) 1315 of the kind discussed earlier has been established for a VCS client. IVN 1315 comprises a plurality of compute instances (such as CIs 1317A and 1317B) within provider network data center portion 1310 of the VCS, as well as a plurality of PVMD-enabled CIs (such as 1318) and 1318K) in the ERG 1335 located at customer data center 1332. The term "PVMD-enabled CI" refers to compute instances launched at client-selected hardware servers with the help of PMVDs of the kind discussed earlier, e.g., such that virtualization management operations for the CIs are performed at the PVMDs. Programs running at any of the CIs may utilize resources of other provider network services in the depicted embodiment. For example, storage instances 1322 of storage service 1330 may be accessed from CI 1017B in the provider network, as well as from CI 1318K in the ERG 1335; similarly, database instances 1342 of database service 1340 may be accessed from CI 1317A within the provider network as well as from CI 1318J in the ERG. In the depicted embodiment, the CIs in the ERG 1335 may be provided access to other provider network services, logically equivalent to the access provided to CIs instantiated within the provider network. Within the ERG 1335 itself, the configuration and use of services that are built on top of VCS compute instances (i.e., services that use CIs as building blocks) may be performed locally in the depicted embodiment, without having to access resources outside the ERG. For example, in one embodiment in which a database instance of a DB service 1340 comprises a CI of the VCS, a new database instance may be created locally within the ERG using an ERG CI 1318J in response to a request for a database instance from another ERG CI 1318K. To the VCS customer on whose behalf ERG 1335 is set up in the depicted embodiment, ERG-based CIs such as 1318J and 1318K may thus appear to be functionally equivalent to CIs such as 1317A and 1317B that are launched within the provider network, even though the control plane components of the VCS are implemented within the provider network data centers and are not replicated at the ERG. In at least some embodiments, in the unlikely event that connectivity between the ERG and the provider network data centers is disrupted, the CIs that have already been instantiated at the ERG, as well as resource instances of other services (such as the database service mentioned above) that have been set up at the ERG may continue to work for at least some period of time; as such, continuous connectivity to the provider network data centers may not be required for a client to use the ERG.

According to at least some embodiments, one or more of the additional provider network services may often be used by submitting requests to addresses accessible from the public Internet; as a result, such requests may have to traverse links of the public Internet. In order to avoid having to use such public network pathways, and also for performance reasons, the VCS may set up private service endpoints (such as endpoint 1399) in some embodiments. Instead of sending requests for a service 1330 or 1340 via the public Internet from a CI 1318, the requests may instead be directed to the private service endpoint 1399, and conveyed to the targeted service using private network pathways of the provider network in such embodiments. The response to the requests may also be transmitted back to the requesters via private pathways configured for or associated with the endpoint 1399 in at least some embodiments. Such private service endpoints may also be set up for services implemented within IVNs of VCS clients in some embodiments. For example, one VCS client C1 may implement a publicly-accessible service 51 in C1's IVN, and allow other clients C2, C3, . . . , of the VCS to access 51 from their respective IVNs via private service endpoints such as 1399. PVMD-enabled CIs such as 1318J and 1318K may also utilize such service endpoints to avoid using public network paths for the service requests and responses in at least some embodiments. In the depicted embodiment, client-specified policies or rules 1388 may be associated with service endpoints, and such policies or rules may be applied to the service-related traffic of any of the CIs 1317 and 1318. For example, such a policy may indicate that only instances 1318) and 1317A of IVN 1335 are permitted to use endpoint 1399 to access a particular storage object SO1 at a storage service 1330. In at least some embodiments, decisions as to whether to forward a packet containing a service request generated at a PVMD-enabled CI such as 1318J or 1318K may be made in accordance with such a policy (e.g., at the PVMD being used for the CI).

Figure 14:
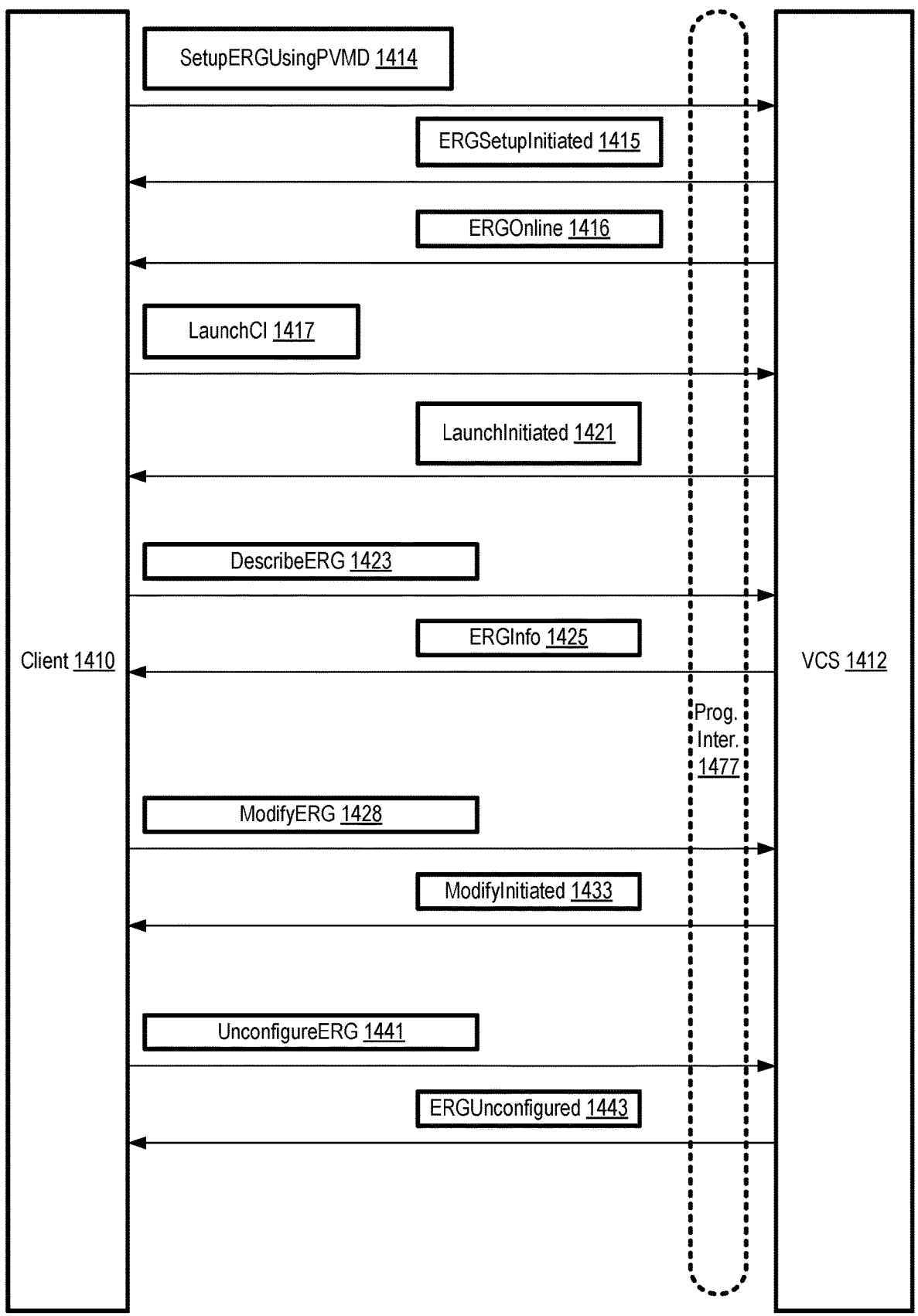
FIG. 14 illustrates example programmatic interactions pertaining to configuring extension resource groups of a virtualized computing service using peripheral devices, according to at least some embodiments.

Example Programmatic Interactions Related to PVMDs Deployed at External Premises In some embodiments, a number of programmatic interfaces may be used by VCS clients to submit requests associated with setting up and using ERGs (similar to ERGs 935 introduced in FIG. 9) with the help of PVMDs introduced in the context of FIG. 9. FIG. 14 illustrates example programmatic interactions pertaining to configuring extension resource groups of a virtualized computing service using peripheral devices, according to at least some embodiments. VCS 1412 may implement one or more programmatic interfaces 1477 in the depicted embodiment, such as a set of application programming interfaces (APIs), web-based consoles, graphical user interfaces, command line tools and the like, any combination of which may be used by VCS clients 1410 to interact with the VCS.

A client 1410 may, for example, submit a SetupERGUsingPMVD message 1414 via a programmatic interface 1477, requesting that an extension resource group with one or more PMVDs be configured at a specified location external to the data centers of the VCS itself. In some embodiments the message 1414 may include properties or details of the client-selected target hardware servers that are to be used for compute instances at the requested ERG, e.g., such as some of the details discussed with respect to the PVMDConnectedTargetServerRequest 714 of FIG. 7. In response to the SetupERGUsingPMVD request 1414, a workflow comprising various preliminary tasks to be performed at the provider network may be initiated in some embodiments, and a response message such as ERGSetupInitiated 1415 may be transmitted to the client. In at least one embodiment, the configuration of one or more extension traffic intermediaries (ETIs) similar to ETIs 1021 of FIG. 10 may be initiated for the requested ERG as part of the preliminary task workflow. For example, a compute instance set up as a CSS proxy may in effect proactively wait to be contacted by an extension manager (EM) at a PMVD located in the targeted external premise in some embodiments. The EM may of course not be able to attempt to communicate with the CSS proxy until the PMVD is delivered or obtained at the external premise, powered on, connected to the Internet and so on in at least some embodiments, which may only occur some amount of time after the SetupERGUsingPMVD request is processed at the VCS 1412. In some embodiments, an ERG connectivity manager of the VCS (similar to ERG connectivity manager 1074 of FIG. 10) may be responsible for instantiating and configuring the ETIs. In at least one embodiment, a given CSS proxy instance may be used for several different CSSs of one or more VCS clients, e.g., in a multi-tenant mode of operation.

In the depicted embodiment, the VCS 1412 may transmit an ERGOnline message 1416 to the client 1410 after the ERG comprising at least one client-selected server and a PVMD connected to the client-selected server has been configured at the desired location, indicating that the client may begin using the ERG. In some embodiments, an implicit communication may be used to inform the client that the requested ERG is ready to use, rather than an explicit message—e.g., an entry for the requested ERG within a console may show via a visual icon that the ERG has become available for use. In at least some embodiments, one or more pre-requisite conditions may have to be met before the equivalent of an ERGOnline message is transmitted to a client: e.g., a secure communication channel that can be used by the CSS proxy instance to transmit administrative commands to the ERG may have to be established, at least one CSS may have to be successfully booted via a PVMD, and so on.

A VCS client 1410 may use programmatic interfaces 1477 to submit a request 1417 to launch one or more compute instances at a specified client-selected server at the ERG in the depicted embodiment. The request 1417 may be transmitted to the VCS control plane by a pathway different from the one-way pathway used to transmit the corresponding command(s) to the ERG in at least some embodiments. After the command to launch the CI(s) has been transmitted to the PVMD at the ERG from the ETIs, a message 1421 indicating that the launch has been initiated may be transmitted back to the client in some embodiments. Note that at least in some embodiments the LaunchInitiated message 1421 may simply indicate that commands to launch the VM(s) have been sent to the ERG; the processes at the PVMD and/or at the client-selected server that actually perform the work to launch the CIs may not necessarily transmit outbound administrative messages confirming whether the launch has succeeded or not in such embodiments.

In some embodiments, a DescribeERG request 1423 may be submitted to obtain information about the compute instances, client-selected servers and/or PVMDs of an ERG, and the requested information may be provided in the form of an ERGInfo message 1425. The information may in some embodiments include, for example, a list of entities authorized to use the ERG (e.g., to launch or terminate CIs at the ERG), the set of client-selected servers and/or CIs of the ERG, the date at which the ERG was set up, ERG billing-related data, etc.

In at least some embodiments, a client 1410 may request a modification of an ERG, e.g., by submitting a ModifyERG request 1428 that indicates the desired changes. Such changes may, for example, include a request to increase or decrease the number of client-selected servers and associated PVMDs of the ERG, to modify the set of users/groups/entities permitted to use the ERGs, and so on. If the modifications requested can be accommodated based on the applicable rules and policies of the VCS, a corresponding workflow to implement the changes may be initiated in the depicted embodiment, and a ModifyInitiated message 1433 indicating the change workflow is underway may be transmitted to the client. In one embodiment, a client 1410 may submit an UnconfigureERG request 1441 to indicate that an ERG is no longer required. In response, the VCS may initiate a workflow to terminate accessibility to the ERG, shut down, dismantle and transport away the equipment set up for the ERG, and an ERGUnconfigured message 1443 may be sent in some embodiments to the client to indicate that the workflow has been initiated and the ERG is no longer accessible for programmatic requests.

In addition to the ERG-related programmatic interactions shown in FIG. 14, a client 1410 may also submit various requests related to the IVNs whose instances ate set up at the ERG, and/or related to individual compute instances set up at the ERG in some embodiments, similar to the requests discussed in the context of FIG. 7. For example, a client may submit requests to obtain network traffic logs of PVMD-enabled compute instances set up in an ERG, to configure private endpoints, and so on. In at least one embodiment, a client may submit a programmatic request to set up a single logical network 1277 such as an IVN that spans multiple external premises, similar to the logical network discussed in the context of FIG. 12, or to add CIs at a specified external premise to an existing logical network. Additional types of programmatic interactions may be supported in some embodiments for ERG-related operations than are shown in FIG. 14 or FIG. 7.

Methods for Configuring and Using PVMDs at External Premises

Figure 15:
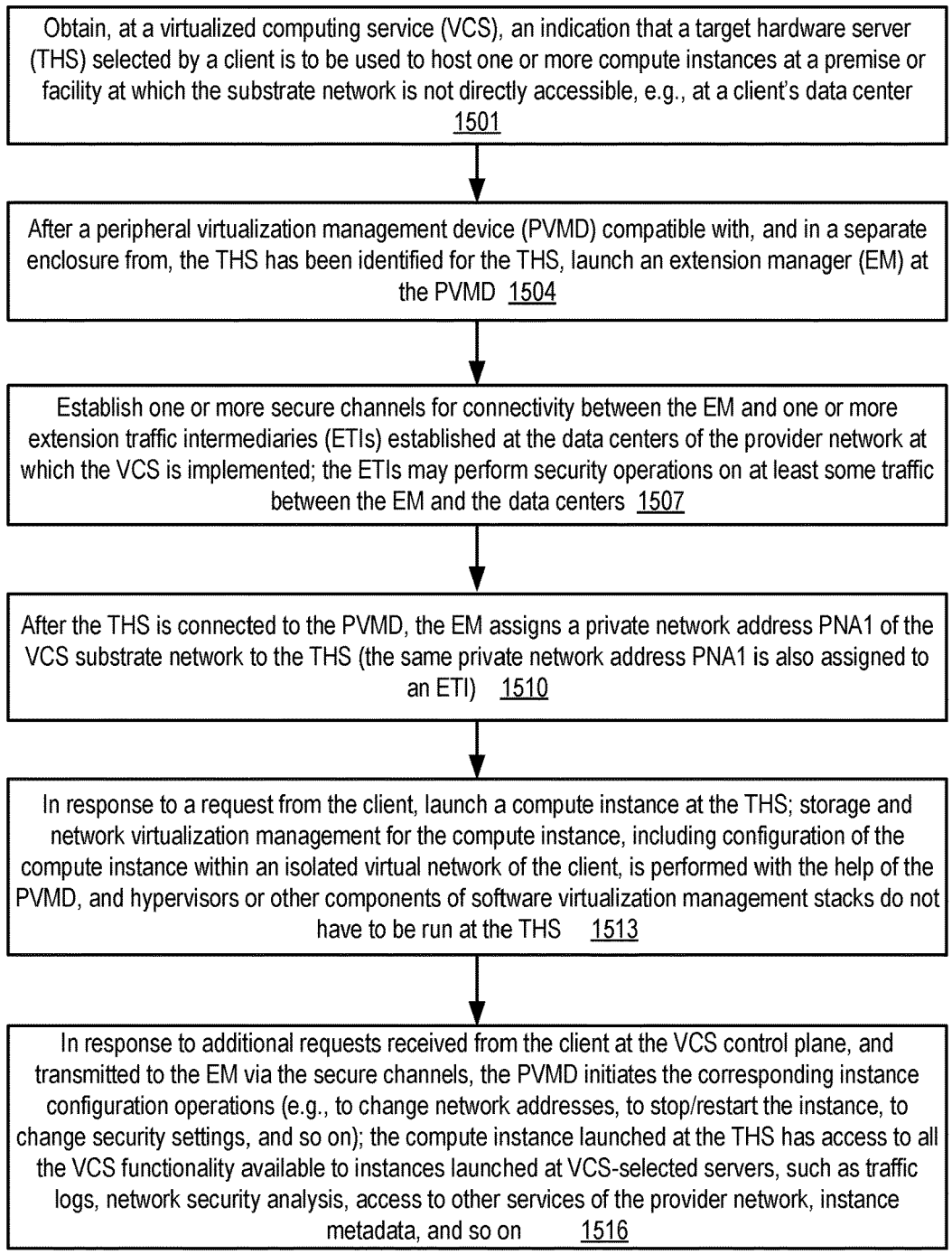
FIG. 15 is a flow diagram illustrating aspects of operations that may be performed to establish extension resource groups using peripheral virtualization management devices, according to at least some embodiments.

FIG. 15 is a flow diagram illustrating aspects of operations that may be performed to establish extension resource groups using peripheral virtualization management devices, according to at least some embodiments. As shown in element 1501, an indication may be obtained at a VCS (e.g., via one or more programmatic interactions with a VCS client), that a target hardware server (THS) selected by the client is to be used to host one or more compute instances at a premise or facility at which the substrate network of the VCS is not accessible directly, such as a client's own data center or some types of co-location facilities. The substrate network may include physical networking equipment of the provider network, such as cables, switches, and like, linking at least some virtualization servers selected as default servers for compute instances by the VCS operator and located at data centers of the provider network at which the VCS is implemented. On top of the substrate, various logical networks may be configured at the VCS, including for example isolated virtual networks (IVNs) of the type discussed earlier. Traffic between entities assigned network addresses of the logical networks (such as various compute instances) may be transmitted over the links of the substrate network, e.g., using an encapsulation protocol and/or a VCS mapping service as discussed in the context of FIG. 2. In various embodiments, traffic between the location at which the THS is located at the data centers of the VCS, where the VCS control plane components and the bulk of the VCS data plane components are located, may have to traverse network pathways of the public Internet and/or other networks not controlled or managed by the provider network, and hence less trusted from the perspective of the VCS than the internal networks of the provider network.

A peripheral virtualization management device (PVMD), similar in features and functionality to PVMDs 960 discussed in the context of FIG. 9, which is to be used to set up compute instances at the THS may be identified, and if needed, transported to the facility at which the THS is to be located in various embodiments. In some embodiments, as discussed earlier in the context of the use of PVMDs in direct substrate connectivity mode, the VCS operator may have several versions or categories of such PVMDs available, which may differ from one another in properties such as the specific type of peripheral connectors/protocols used, the total on-device computing power, the types of local persistent storage devices incorporated within the PVMDs, the capacity of local persistent storage devices, the physical footprints of the PVMDs, and so on. In such embodiments, a PVMD that is compatible with the THS may be identified and used—e.g., a PVMD that can be connected via a peripheral protocol supported at the THS may be selected, or a PVMD that is configured to enable compute instances of a specific type preferred by the client, may be found for use with the THS.

In addition to the baseline PVMD components used when direct access to the substrate is available, the PVMD to be used with the THS at the external premise may include an extension manager (EM) of the kind discussed in the context of FIG. 9 in various embodiments. Such an EM may be launched (element 1504) in some embodiments based on detecting that the PVMD has been connected to a power source and to the Internet (e.g., using an Ethernet or similar cable linked to a local network set up at the external premise, which is in turn linked to the Internet). In other embodiments, other triggering conditions or commands may lead to the launching of the EM at the PVMD.

One or more secure network channels (e.g., respective tunnels for control plane traffic and data plane traffic) may be established between the EM and a set of extension traffic intermediaries (ETIs) similar to the ETIs discussed earlier (element 1507). The ETIs may be configured at the data centers used for the VCS in the depicted embodiment, e.g., at one or more compute instances within an isolated virtual network set up on behalf of the VCS to manage connectivity with external premises. In some embodiments, an external resource group (ERG) connectivity manager within the VCS control plane may establish the ETIs. At least some of the ETIs may be configured to perform security operations on at least a portion of the traffic between the EM and the data centers (such as encrypting/decrypting the packets, stripping or substituting credentials as discussed earlier, and so on).

The PVMD (and the VCS control plane, based on communications from the PVMD) may detect that connectivity has been established between the PVMD and the THS in the depicted embodiment. In at least one embodiment, multiple physical connections may be established between the PVMD and the THS—e.g., one connection may utilize a first cable linked to an external PCIe port of the PVMD, while another connection may utilize an RJ45 connector to enable commands and data to be transferred between the PVMD and a system management service processor of the THS. After the THS is connected to the PVMD, the EM may assign a private network address PNA1 of the substrate network (i.e., an address selected from a range of addresses assigned to VCS virtualization servers within the provider network data centers) to the THS (element 1510). PNA1 may also be assigned to one or more of the ETIs in some embodiments, e.g., via a programmatically attached virtual network interface as discussed earlier, enabling such ETIs to serve as proxies for the THS within the substrate network. Note that the THS may also be assigned one or more other network addresses, e.g., within a local network of the external premise in at least some embodiments; the substrate network address PNA1 may be used for traffic between the VCS data centers and the THS, while the local network address may be used at least for traffic between the THS and other devices at the external premise in such embodiments.

The PVMD may cause the THS to be presented, e.g., via a control-plane programmatic interface of the VCS accessible to the client, as a dedicated virtualization host in some embodiments. Such a dedicated virtualization host may be indicated by the client as the resource to be used to launch one or more compute instances in single-tenant mode in some embodiments—that is, as suggested by the term "dedicated", such a virtualization host may be usable on behalf of only a single client. In other embodiments, the THS may be presented as a different type of virtualization host.

After the THS has been assigned the substrate address and presented as a virtualization host, the client may use the THS for various configuration operations related to compute instances, just like other virtualization hosts located within the provider network data centers may be used in the depicted embodiment. In response to a programmatic request from the client, an indication of which is received at the EM via the one or more secure channels, a compute instance may be launched at the THS, for example (element 1513). In addition to secure connectivity with the VCS, baseline storage and network virtualization tasks may be implemented at the PVMD for such a compute instance, including for example configuration of a root volume using persistent storage of the PVMD, inclusion of the compute instance within an IVN of the client, and so on. Hypervisors or other components of the software virtualization management stacks may not have to be run at the THS in the depicted embodiment, enabling the client to use all (or at least the vast majority) of the computational, memory and storage capacity of the THS for the client's applications.

After a compute instance is launched at the THS at the external premise, it may be treated (from the perspective of the client) just like any other compute instance of the client, and may have access to all the VCS features available to compute instances launched without the help of PVMDs in at least some embodiments. In response to additional requests received from the client at the VCS control plane, and transmitted to the EM via the secure channels, the corresponding instance configuration operations may be initiated by the PVMD in some embodiments for the compute instance launched at the THS (element 1516). Such operations may include, for example, changing network addresses, stopping/restarting the instance, changing security settings and the like. Logs of network traffic of the compute instance (including DNS requests and responses) may be generated and provided to clients on request in the depicted embodiment. Network security analysis, e.g., for intrusion detection, exfiltration detection, and the like may be performed in some embodiments with the help of the PVMD and/or components of the VCS. Access to other services (such as database services, storage services, load balancing services and the like) implemented at the provider network may be provided to programs running at the THS's compute instance. An agent of an instance metadata service may be run at the PVMD to provide instance metadata for the compute instance, e.g., including credentials needed to access some of the other services. Respective compute instances set up using several different THSs at one or more external premises may be configured as part of the same isolated virtual network (IVN) in some embodiments. In some cases, an IVN may include one or more compute instances set up within provider network data centers, as well as one or more compute instances set up using PVMDs and THSs at an external premise.

Figure 16:
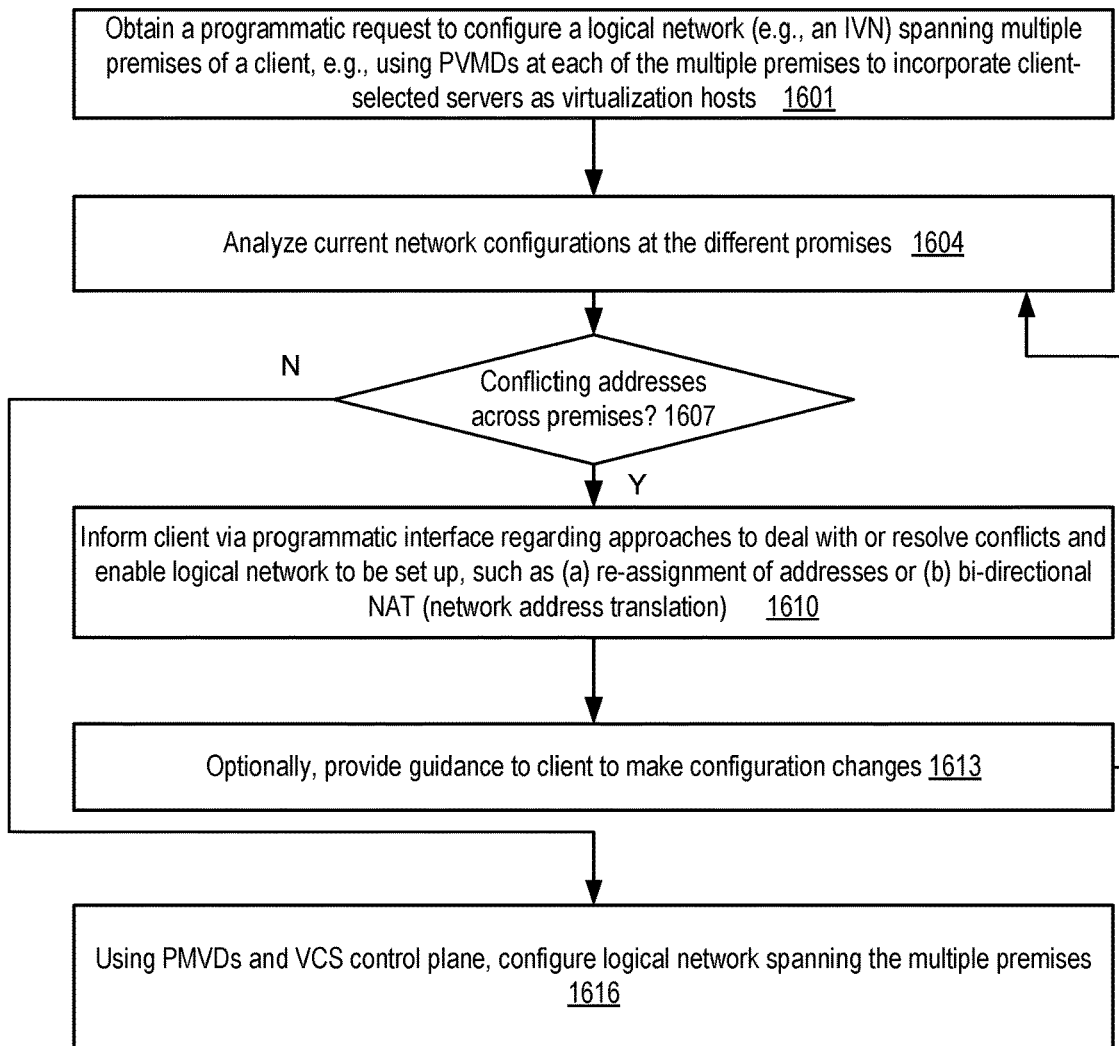
FIG. 16 is a flow diagram illustrating aspects of operations that may be performed to enable multi-premise logical networks to be established in environments in which conflicting network addresses may have been assigned at a plurality of the premises, according to at least some embodiments.

As mentioned earlier, in some embodiments network addresses used for local networks at several external premises may overlap; if left unaddressed, this may cause problems with regard to configuring multi-premise logical networks using PVMDs, as the VCS may expect all virtualization hosts of the substrate network to have unique network addresses. FIG. 16 is a flow diagram illustrating aspects of operations that may be performed to enable multi-premise logical networks to be established in environments in which conflicting network addresses may have been assigned at a plurality of the premises, according to at least some embodiments. As shown in element 1601, a programmatic request may be received, e.g., at the VCS control plane, to configure a logical network (such as an IVN) that spans multiple external premises. The request may indicate, for example, that respective PVMDs are to be used at each of the premises to incorporate client-selected servers as virtualization hosts of the VCS.

In some embodiments, as a precondition for establishing such a logical network, the current networking configurations (including the ranges of network addresses assigned to various servers including the client-selected servers, and/or to be assigned to client-selected servers if they have not yet been configured) of the various premises may be obtained at the VCS programmatically. Such configuration information may be examined (element 1604), e.g., by control-plane components of the VCS.

If a determination is made that the addresses assigned to (or to be assigned later to) various servers conflict across the different premises, as detected in operations corresponding to element 1607, the VCS may in some embodiments inform the client via a programmatic interface regarding one or more approaches to deal with or resolve the address conflicts (element 1610). Such approaches may include, for example, re-assignment of the network addresses (e.g., assigning addresses from respective non-overlapping IP address ranges at the different premises), and/or implementing a bi-directional network address translation (NAT) algorithm. In bi-directional NAT, addresses of both the source and the destination of a given packet may be translated at a networking intermediary such as a virtual or physical router or traffic hub in various embodiments. In some embodiments, the VCS may provide more detailed guidance (e.g., suggesting new non-overlapping ranges of IP addresses, instructions for establishing a virtual router or hub for NAT, etc.) to the client to make the needed configuration changes (element 1613). If the client wishes to proceed with the establishment of the multi-premise logical network, configuration changes may be made at one or more of the premises, and operations corresponding to elements 1604 onwards may be performed again.

If no address conflicts are detected (as also determined in operations corresponding to element 1607), the logical network spanning multiple premises may be configured (element 1616), e.g., using PVMDs at the external premises and the VCS control plane resources. For example, extension managers (EMs) similar to those discussed earlier may be used to enable secure connectivity between servers at the external premises and the VCS data centers, and compute instances set up at target hardware servers selected by the clients and linked to the PVMDs may be assigned network addresses within a single IVN in some embodiments.

It is noted that in various embodiments, some of the operations shown in FIG. 15 and/or FIG. 16 may be implemented in a different order than that shown in the figure, or may be performed in parallel rather than sequentially. Additionally, some of the operations shown in FIG. 15 and/or FIG. 16 may not be required in one or more implementations.

Use Cases

The techniques described above, of enabling compute instances of virtualized computing services of a provider network to be launched at client-selected servers using small-footprint external peripheral devices, and of logically extending the data plane of the virtualized computing service into customer premises using such devices, may be extremely useful in a variety of scenarios. Many organizations that utilize provider network resources (such as virtual machines of various capability levels) for features such as scalability, availability, reliability, and security may wish to utilize similar features at hardware servers of the their choice—e.g., at hardware servers that are familiar to the IT staff of the organizations, or are optimized for certain types of applications. The peripheral devices described may be attachable to such servers with minimal effort, e.g., at data centers of the provider network at which the bulk of the virtualized computing resources reside, at co-location facilities and/or at customer premises. In some cases, the peripheral devices may simply be placed in the same rack as the client-selected hardware server, and connected to the server using standard cables, to allow compute instances to be launched at the servers. Such compute instances may automatically and transparently inherit all the features of compute instances that are launched using servers selected by the virtualized computing service operators, such as secure access to other services, automated metrics and log collection, network intrusion detection and so on. In some cases clients may prefer to launch instances using selected hardware at the clients' own premises, e.g., because of access to large amounts of application data that may be stored at the locations; provider network clients may prefer to avoid the costs and/or delays associated with transferring such large volumes of data over the Internet to the provider network's own data centers, and may wish to ensure that the data does not leave the customers' own premises, if possible. Clients may sometimes need to use compute instances, and/or services which use the compute instances as building blocks, in remote locations (e.g., near oil rigs, cell phone towers, scientific data gathering sensor arrays and the like) with potentially unreliable or expensive connections to the Internet. Some organizations may, for example, have a large number of engineers/designers in an office or other physical location, and may need rendering or other compute intensive operations to be performed using compute instances within very low-latency distances of the engineers/designers. The ability to support, using local equipment at any desired location with Internet connectivity, the same capabilities as those offered at provider network data centers may greatly expand the range of applications that can be run efficiently and securely by provider network clients.

Illustrative Computer System

Figure 17:
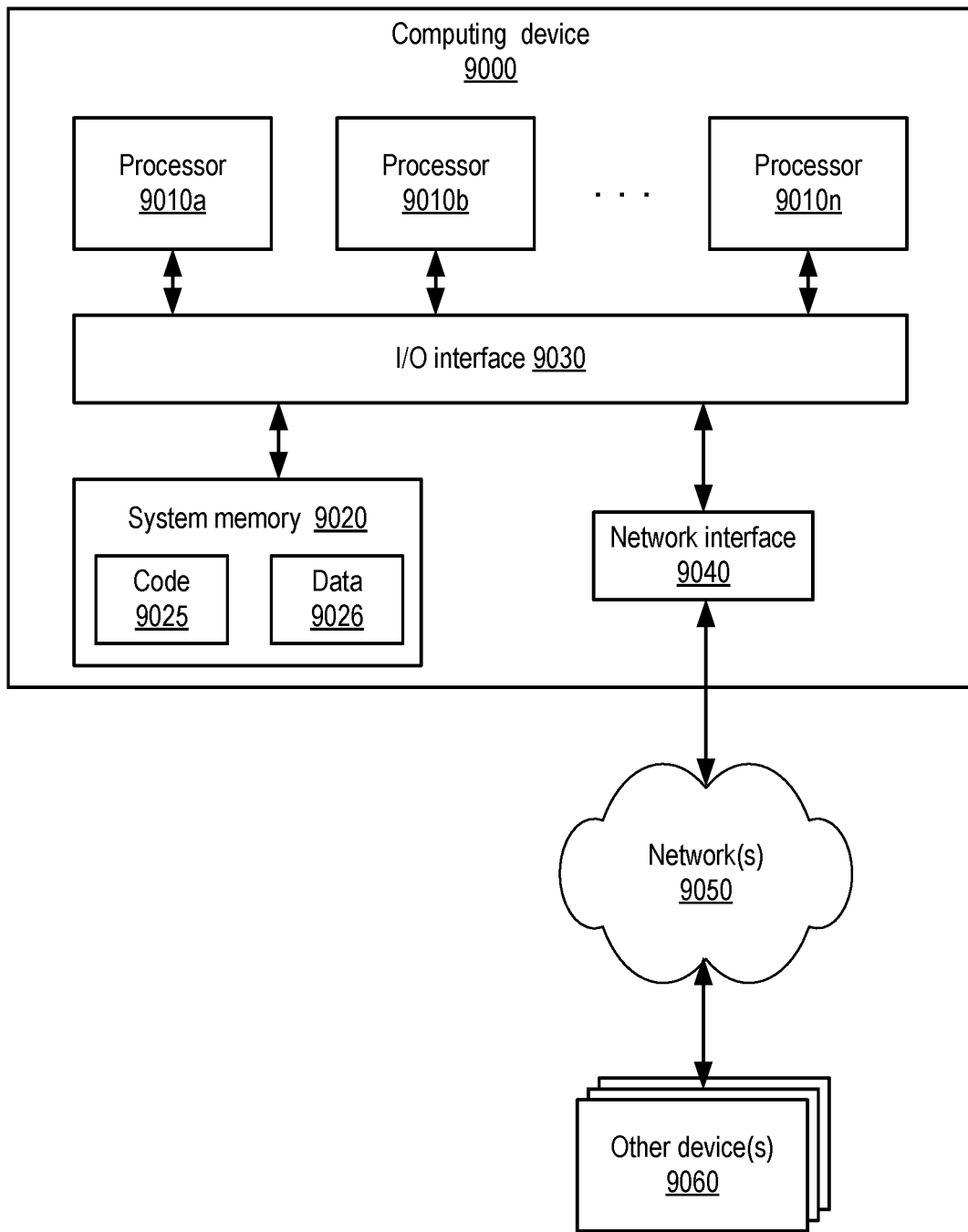
FIG. 17 is a block diagram illustrating an example computing device that may be used in at least some embodiments.

In at least some embodiments, a server that implements one or more of the control-plane and data-plane components that are used to support the types of techniques described herein (e.g., establishing connectivity with PVMDs, the setting up and use of extension resource groups of virtualized computing services at selected locations outside a provider network's data centers, etc.), and or a client-selected server used to host compute instances, may include a general-purpose computer system that includes or is configured to access one or more computer-accessible media. FIG. 17 illustrates such a general-purpose computing device 9000. In the illustrated embodiment, computing device 9000 includes one or more processors 9010 coupled to a system memory 9020 (which may comprise both non-volatile and volatile memory modules) via an input/output (I/O) interface 9030. Computing device 9000 further includes a network interface 9040 coupled to I/O interface 9030.

In various embodiments, computing device 9000 may be a uniprocessor system including one processor 9010, or a multiprocessor system including several processors 9010 (e.g., two, four, eight, or another suitable number). Processors 9010 may be any suitable processors capable of executing instructions. For example, in various embodiments, processors 9010 may be general-purpose or embedded processors implementing any of a variety of instruction set architectures (ISAs), such as the x86, PowerPC, SPARC, or MIPS ISAs, or any other suitable ISA. In multiprocessor systems, each of processors 9010 may commonly, but not necessarily, implement the same ISA. In some implementations, graphics processing units (GPUs) may be used instead of, or in addition to, conventional processors.

System memory 9020 may be configured to store instructions and data accessible by processor(s) 9010. In at least some embodiments, the system memory 9020 may comprise both volatile and non-volatile portions; in other embodiments, only volatile memory may be used. In various embodiments, the volatile portion of system memory 9020 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 9020 as code 9025 and data 9026.

In one embodiment, I/O interface 9030 may be configured to coordinate I/O traffic between processor 9010, system memory 9020, and any peripheral devices in the device, including network interface 9040 or other peripheral interfaces such as various types of persistent and/or volatile storage devices. In some embodiments, I/O interface 9030 may perform any necessary protocol, timing or other data transformations to convert data signals from one component (e.g., system memory 9020) into a format suitable for use by another component (e.g., processor 9010). In some embodiments, I/O interface 9030 may include support for devices attached through various types of peripheral buses, such as a variant of the Peripheral Component Interconnect (PCI) bus standard or the Universal Serial Bus (USB) standard, for example. In some embodiments, the function of I/O interface 9030 may be split into two or more separate components, such as a north bridge and a south bridge, for example. Also, in some embodiments some or all of the functionality of I/O interface 9030, such as an interface to system memory 9020, may be incorporated directly into processor 9010.

Network interface 9040 may be configured to allow data to be exchanged between computing device 9000 and other devices 9060 attached to a network or networks 9050, such as other computer systems or devices as illustrated in FIG. 1 through FIG. 16, for example. In various embodiments, network interface 9040 may support communication via any suitable wired or wireless general data networks, such as types of Ethernet network, for example. Additionally, network interface 9040 may support communication via telecommunications/telephony networks such as analog voice networks or digital fiber communications networks, via storage area networks such as Fibre Channel SANs, or via any other suitable type of network and/or protocol.

In some embodiments, system memory 9020 may represent one embodiment of a computer-accessible medium configured to store at least a subset of program instructions and data used for implementing the methods and apparatus discussed in the context of FIG. 1 through FIG. 16. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 9000 via I/O interface 9030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 9000 as system memory 9020 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 9040. Portions or all of multiple computing devices such as that illustrated in FIG. 17 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system, comprising:
one or more computing devices of a virtualized computing service of a cloud provider network;
a target hardware server indicated by a client of the cloud provider network; and
a peripheral device, located within a physical enclosure external to the target hardware server, comprising program instructions that when executed at or across one or more processors of the peripheral device implement (a) one or more storage managers, and (b) one or more networking managers;
wherein the peripheral device is configured to:
establish connectivity with a substrate network of the virtualized computing service via a first cable, wherein an encapsulation protocol implemented at a plurality of devices attached to the substrate network is used to transmit traffic between one or more logical networks of the virtualized computing service;
subsequent to a determination that (a) a peripheral card of the target hardware server has been linked via a second cable to an external peripheral port of the peripheral device, and (b) a system management processor of the target hardware server has been linked via a third cable to the peripheral device, cause the one or more computing devices of the virtualized computing service to present the target hardware server to the client as a dedicated virtualization host selectable by the client to run one or more compute instances, wherein the target hardware server is linked to the substrate network only via the peripheral device; and
initiate one or more configuration operations of a compute instance launched at the target hardware server on behalf of the client, wherein the compute instance is configured within an isolated virtual network of the cloud provider network based at least in part on operations performed using the one or more networking managers, and wherein the compute instance is provided access to a root volume based at least in part on operations performed by the one or more storage managers.

2. The system as recited in claim 1, wherein the compute instance is a bare metal instance, wherein from the bare metal instance, one or more hardware resources of the target hardware server are accessible without virtualization.

3. The system as recited in claim 1, wherein the one or more computing devices are configured to present the target hardware server as the dedicated virtualization host in response to a programmatic request received from a client, wherein the programmatic request indicates one or more properties of the target hardware server.

4. The system as recited in claim 1, wherein the target hardware server is located within a data center of one or more data centers of the cloud provider network at which the virtualized computing service is implemented.

5. The system as recited in claim 1, wherein the peripheral card is linked to the peripheral device using one or more of: (a) a PCIe (Peripheral Component Interconnect Express) connector, (b) a connector configured to multiplex PCIe signals with one or more other types of signals, or (c) a USB (Universal Serial Port) connector.

6. A method, comprising:
    determining, at a peripheral device comprising one or more virtualization offloading components including a storage manager, that connectivity has been established with a substrate network of a virtualized computing service comprising computing devices attached to the substrate network of the virtualized computing service, and wherein an encapsulation protocol implemented at the computing devices attached to the substrate network is used to transmit traffic between logical networks of the virtualized computing service;
    detecting, at the peripheral device, that a target hardware server has been linked to the peripheral device, wherein the peripheral device is in an enclosure external to the target hardware server;
    causing, by the peripheral device, the target hardware server to be presented to a client of the virtualized computing service as a virtualization host selectable by the client to run one or more compute instances configured to transmit traffic with one or more of the logical networks of the virtualized computing service via the encapsulation protocol; and
    initiating, by the one or more virtualization offloading components of the peripheral device, one or more configuration operations of a compute instance launched at the target hardware server on behalf of the client.

7. The method as recited in claim 6, wherein the one or more configuration operations include configuration, by the storage manager, of a root volume of the compute instance.

8. The method as recited in claim 6, wherein the peripheral device comprises one or more persistent storage devices including at least one persistent storage device accessible via an NVME (non-volatile memory express) interface from the compute instance.

9. The method as recited in claim 6, wherein the virtualized computing service is implemented at a provider network, the method further comprising:
    transmitting, via the peripheral device, a service request directed to another service of the provider network, wherein the service request originates at the compute instance.

10. The method as recited in claim 6, wherein the target hardware server is linked to the peripheral device using one or more of: (a) a PCIe (Peripheral Component Interconnect Express) connector, (b) a connector configured to multiplex PCIe signals with one or more other types of signals, or (c) a USB (Universal Serial Bus) connector.

11. The method as recited in claim 6, wherein the target hardware server is linked to the peripheral device using one or more of: (a) a signal re-timer card or (b) a signal repeater card.

12. The method as recited in claim 6, wherein the peripheral device comprises one or more of: (a) a network interface card (NIC) emulator or (b) an isolated virtual network connectivity manager, wherein the first compute instance is configured within a first isolated virtual network, the method further comprising:
    performing, at the peripheral device, one or more operations of the encapsulation protocol on a packet generated at the compute instance, wherein the packet is directed to a destination configured within the isolated virtual network of the virtualized computing service.

13. The method as recited in claim 6, wherein the peripheral device comprises a persistent storage device and a removable security device, wherein a removal of the removable security device from the peripheral device renders at least a portion of the persistent storage device unreadable.

14. The method as recited in claim 6, wherein a control plane of the virtualized computing service comprises a plurality of computing devices located in one or more data centers, wherein the peripheral device and the target hardware server are located at a premise external to the one or more data centers.

15. The method as recited in claim 6, wherein the target hardware server comprises a baseboard management controller, and wherein the detecting that the target hardware server has been linked to the peripheral device comprises detecting that the peripheral device is connected to the baseboard management controller.

16. A peripheral device, comprising:
    an enclosure; and
    one or more processors and one or more memories mounted in the enclosure,
    wherein:
        the one or more memories include program instructions that when executed on or across the one or more processors implement one or more virtualization offloading components of a virtualized computing service of a provider network,
        the virtualized computing service comprises a plurality of computing devices attached to a substrate network and the virtualization offloading components of the peripheral device provide a connection mechanism to the substrate network of the virtualized computing service, and
        the one or more virtualization offloading components include a storage manager; and
    a port connectable to a target hardware server;
    wherein the one or more virtualization offloading components are configured to:
        cause network connectivity to be established with one or more computing devices of a control plane of the virtualized computing service;
        based at least in part on detecting that a particular hardware server has been linked to the port, cause the control plane to present the particular server to a client of the virtualized computing service as a virtualization host, wherein the enclosure of the peripheral device is separate from the particular hardware server; and initiate one or more compute instance configuration operations at the particular hardware server in response to a determination that a command has been received at the control plane, including at least one configuration operation initiated by the storage manager to enable a logical storage device to be accessed from a compute instance launched at the particular hardware server.

17. The peripheral device as recited in claim 16, wherein the one or more virtualization offloading components include a networking manager configured to store an indication of a network address assigned to the compute instance configured at the particular hardware server, wherein the network address is within a range of private network addresses of an isolated virtual network established at the virtualized computing service.

18. The peripheral device as recited in claim 16, wherein the one or more virtualization offloading components include an instance metadata agent configured to provide, to the compute instance launched at the particular hardware server, a credential to access a service other than the virtualized computing service.

19. The peripheral device as recited in claim 16, further comprising a persistent storage device, wherein the storage manager is configured to enable access from the compute instance to the persistent storage device.

20. The peripheral device as recited in claim 16, wherein the target hardware server is installed in one or more slots of a server rack, and wherein the peripheral device is installed into a different slot of the server rack.

* * * * *